United States Patent
Won et al.

(10) Patent No.: US 11,367,467 B2
(45) Date of Patent: Jun. 21, 2022

(54) SEMICONDUCTOR DEVICE WITH MEMORY BANKS AND SENSE AMPLIFIER ARRAYS

(71) Applicant: SK hynix Inc., Gyeonggi-do (KR)

(72) Inventors: Hyung Sik Won, Chungcheongbuk-do (KR); Seung Han Oak, Gyeonggi-do (KR); Jun Phyo Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/938,599

(22) Filed: Jul. 24, 2020

(65) Prior Publication Data
US 2020/0365191 A1 Nov. 19, 2020

Related U.S. Application Data

(62) Division of application No. 16/103,059, filed on Aug. 14, 2018, now Pat. No. 10,762,930.

(30) Foreign Application Priority Data

Jan. 8, 2018 (KR) .................. 10-2018-0002321

(51) Int. Cl.
| | | |
|---|---|---|
| *G11C 5/06* | (2006.01) | |
| *G11C 7/08* | (2006.01) | |
| *G11C 8/12* | (2006.01) | |
| *G11C 5/02* | (2006.01) | |
| *G11C 7/06* | (2006.01) | |
| *G11C 5/14* | (2006.01) | |

(52) U.S. Cl.
CPC .............. *G11C 5/063* (2013.01); *G11C 5/025* (2013.01); *G11C 7/065* (2013.01); *G11C 7/08* (2013.01); *G11C 8/12* (2013.01); *G11C 5/14* (2013.01); *G11C 2207/002* (2013.01); *G11C 2207/005* (2013.01)

(58) Field of Classification Search
CPC ......... G11C 5/063; G11C 5/025; G11C 7/065; G11C 7/08; G11C 8/12; G11C 2207/005; G11C 2207/002; G11C 5/14
See application file for complete search history.

(56) References Cited

U.S. PATENT DOCUMENTS

| | | | | |
|---|---|---|---|---|
| 5,822,264 A | * | 10/1998 | Tomishima ........... | G11C 11/406 365/222 |
| 6,442,078 B1 | * | 8/2002 | Arimoto ................. | G11C 7/10 365/189.08 |

(Continued)

OTHER PUBLICATIONS

Office Action by the Taiwan Intellectual Property Office dated Dec. 2, 2021.

*Primary Examiner* — Khamdan N. Alrobaie
(74) *Attorney, Agent, or Firm* — IP & T Group LLP

(57) ABSTRACT

A semiconductor device may include a plurality of memory banks arranged in a first direction; an address decoder arranged at one side of the memory banks; a plurality of local sense amplifier arrays arranged under each of the memory banks; a plurality of first input/output lines connected between the memory banks and the local sense amplifier arrays corresponding to each of the memory banks; and at least one second input/output line connected to the local sense amplifier arrays and extended in the first direction.

13 Claims, 19 Drawing Sheets

(56) References Cited

U.S. PATENT DOCUMENTS

| | | | |
|---|---|---|---|
| 7,259,978 B2* | 8/2007 | Park | G11C 5/063 365/63 |
| 10,020,038 B1* | 7/2018 | Nishizaki | G11C 7/18 |
| 2002/0131316 A1* | 9/2002 | Noh | G11C 11/4097 365/230.03 |
| 2017/0358334 A1 | 12/2017 | Onuki | |

* cited by examiner

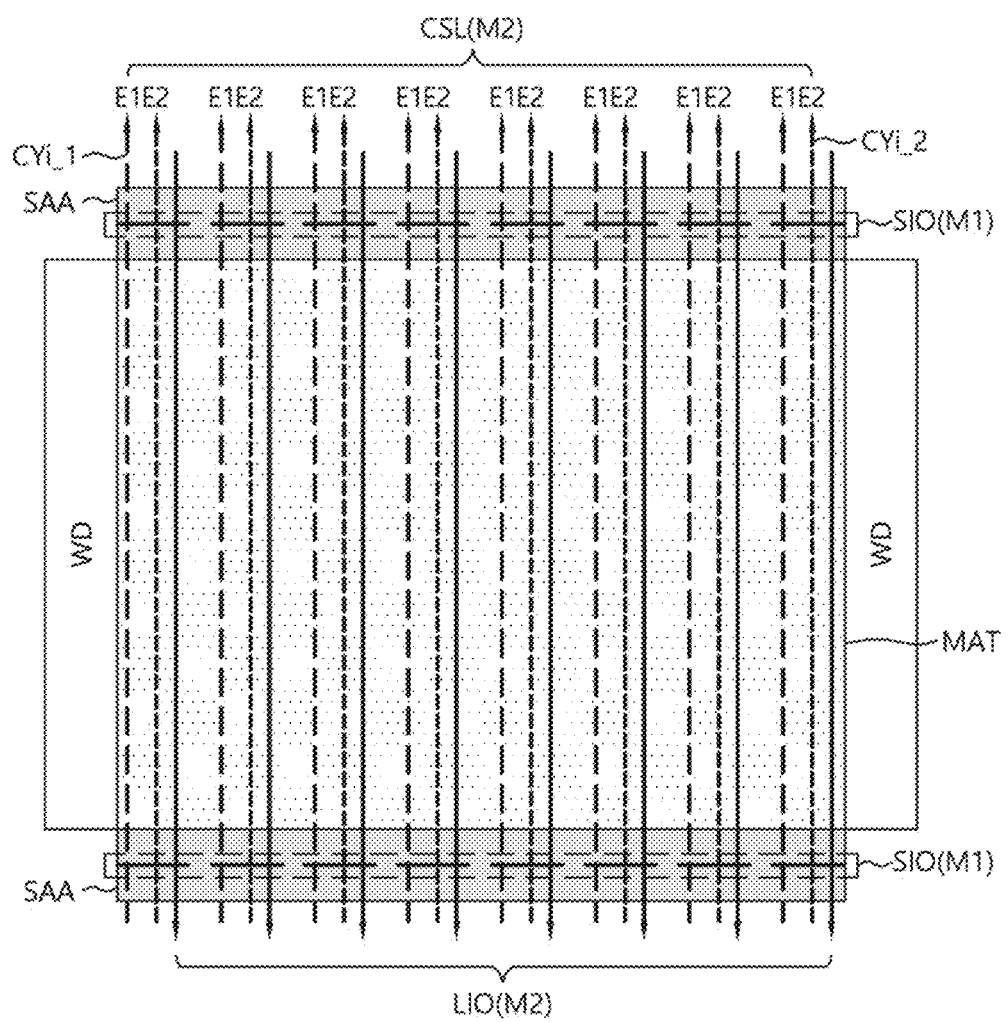

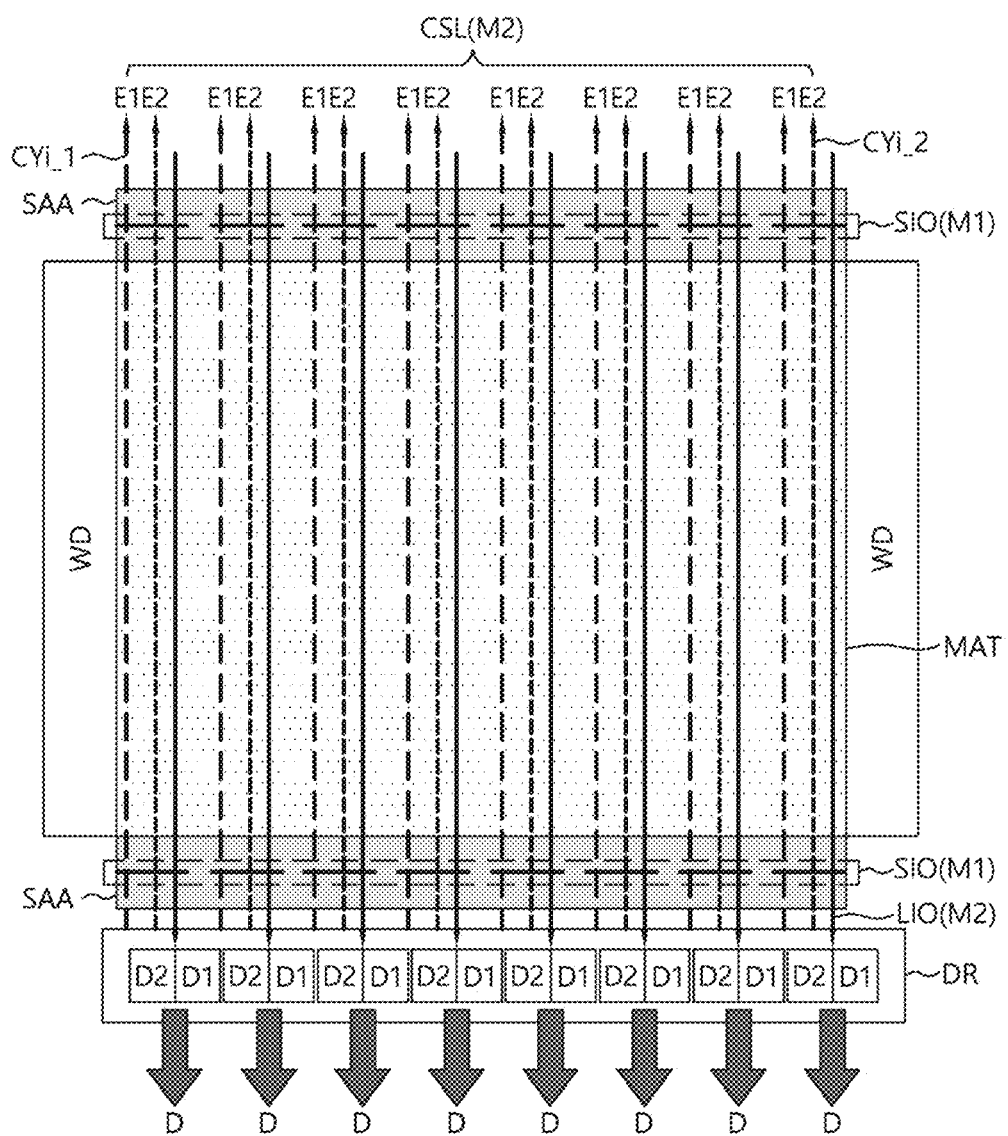

SEMICONDUCTOR DEVICE WITH MEMORY BANKS AND SENSE AMPLIFIER ARRAYS

CROSS-REFERENCES TO RELATED APPLICATION

This application is a division of U.S. patent application Ser. No. 16/103,059 filed on Aug. 14, 2018, which claims benefits of priority of Korean Patent Application No. 10-2018-0002321 filed on Jan. 8, 2018. The disclosure of each of the foregoing application is incorporated herein by reference in its entirety.

BACKGROUND

1. Technical Field

Various embodiments of the present invention generally relate to a semiconductor device. Particularly, the embodiments relate to a semiconductor memory device.

2. Related Art

Generally, a semiconductor memory device such as a dynamic random access memory (DRAM) may include a plurality of memory cell arrays. The memory cell arrays may include memory cells for storing data. The memory cell may be accessed by controlling a word line and a bit line.

As the semiconductor memory device becomes more highly integrated, it may be required to provide the semiconductor memory device with bigger data storage capacity and a smaller size. In order to store the massive data, it may be required to provide the memory cell array with a large size. However, the large size of the memory cell array may hinder the high integration of the semiconductor memory device.

SUMMARY

Example embodiments may provide a semiconductor device capable of reducing power consumption and increasing an operational speed.

In an embodiment of the present disclosure, a semiconductor device may include: a plurality of memory banks arranged in a first direction; an address decoder arranged at one side of the memory banks; a plurality of local sense amplifier arrays arranged under each of the memory banks; a plurality of first input/output lines connected between the memory banks and the local sense amplifier arrays corresponding to each of the memory banks; and at least one second input/output line connected to the local sense amplifier arrays and extended in the first direction.

In an embodiment of the present disclosure, a semiconductor device may include: a plurality of MATs including a plurality of memory cells, the MATs adjacent to each other in a first direction; a plurality of first sense amplifier arrays arranged between the MATs, each of the first sense amplifier arrays including a plurality of first sense amplifiers; and a plurality of column selection signal lines extended on the first sense amplifier arrays in a second direction substantially perpendicular to the first direction to transmit column selection signals to the first sense amplifiers.

In an embodiment of the present disclosure, a semiconductor device may include: a MAT including a plurality of memory cells; a plurality of sense amplifier arrays arranged at one side of the MAT, each of the first sense amplifier arrays including a plurality of sense amplifiers; a plurality of first input/output lines arranged on the sense amplifier array, spaced apart from each other in a first direction and connected with the at least one sense amplifier through a switching element; a plurality of column selection signal lines for transmitting a column selection signal to the switching element; and a plurality of second input/output lines connected to the first input/output lines through a contact and extended on the MAT in a second direction substantially perpendicular to the first direction.

In an embodiment of the present disclosure, a semiconductor device may include: memory cell groups arranged in a first direction; normal sense amplifier arrays arranged between the memory cell groups, and suitable for amplifying data of neighboring ones among the memory cell groups according to column selection signals; first and second edge sense amplifier arrays arranged on uppermost and lowermost ones among the memory cell groups, respectively, and suitable for amplifying data of the uppermost and lowermost memory cell groups according to column selection signals; column selection signal lines extended on the normal sense amplifier arrays in a second direction, and suitable for transferring the column selection signals to the normal sense amplifier arrays; segment input/output lines substantially coplanar with the column selection signal lines, and suitable for transferring the amplified data; local input/output lines extended in the first direction on a higher level than the segment input/output lines, and suitable for transferring the amplified data provided through the segment input/output lines; local sense amplifier arrays arranged under the memory cell groups, and suitable for further amplifying the data provided through the local input/output lines; and global input/output lines arranged on a higher level than the local input/output lines, and suitable for transferring the data amplified by the local sense amplifier arrays.

According to example embodiments, a quantity of data, which may be simultaneously inputted/outputted into/from the single MAT, may be increased by increasing numbers of the data input/output lines in the single MAT.

Further, because the quantity of the data simultaneously inputted/outputted into/from the single MAT may be increased, a memory size driven when inputting/outputting the data may have a small size so that the semiconductor device may have low power consumption and improved operational speed.

BRIEF DESCRIPTION OF THE DRAWINGS

The above and other aspects, features and advantages of the subject matter of the present disclosure will be more clearly understood from the following detailed description taken in conjunction with the accompanying drawings, in which:

FIGS. 7A to 7C are plan layout views illustrating a segment input/output line, a local input/output line, and a column selection signal line in accordance with embodiments of the present disclosure;

FIG. 8 is a view illustrating a data register;

DETAILED DESCRIPTION

Figure 1:
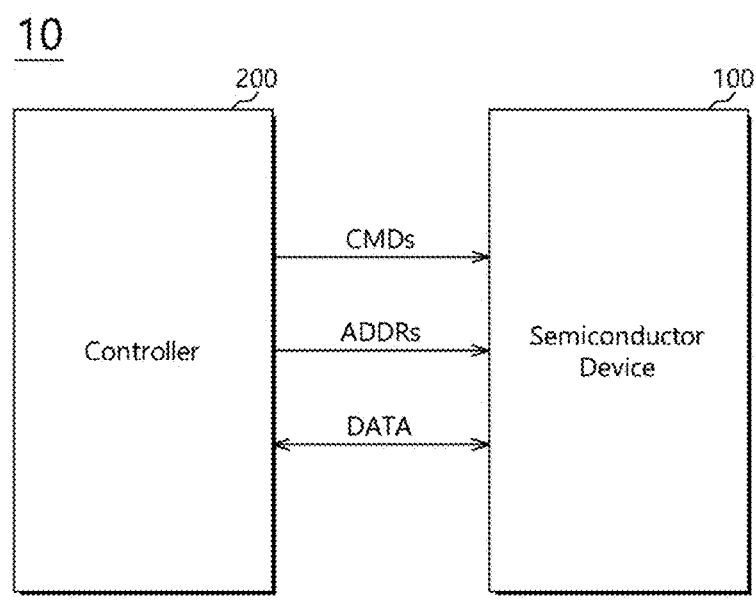
FIG. 1 is a block diagram illustrating a semiconductor system in accordance with an embodiment of the present disclosure.

Various embodiments of the present invention are described below in more detail with reference to the accompanying drawings. We note, however, that the present invention may be embodied in different forms and variations, and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention. It is noted that reference to "an embodiment" does not necessarily mean only one embodiment, and different references to "an embodiment" are not necessarily to the same embodiment(s).

The drawings are not necessarily to scale and, in some instances, proportions may have been exaggerated in order to clearly illustrate features of the embodiments.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention.

As used herein, singular forms may include the plural forms as well and vice versa, unless the context clearly indicates otherwise.

The present disclosure is described herein with reference to cross-section and/or plan illustrations of idealized embodiments of the present disclosure. However, embodiments of the present disclosure should not be construed as limiting the inventive concept. Although a few embodiments of the present disclosure will be shown and described, it will be appreciated by those of ordinary skill in the art that changes may be made in these embodiments without departing from the principles and spirit of the present disclosure.

FIG. 1 is a block diagram illustrating a semiconductor system 10 in accordance with an embodiment of the present disclosure.

Referring to FIG. 1, the semiconductor system 10 may include a semiconductor device 100 and a controller 200.

In order to perform operations such as a read operation, a write operation, a refresh operation, etc., requested from a host device, the controller 200 may control operations of the semiconductor device 100. The controller 200 may control the operations of the semiconductor device 100 by transmitting commands CMDs and addresses ADDRs to the semiconductor device 100 in response to the requests from the host device. Data DATA may be transmitted between the controller 200 and the semiconductor device 100 when performing the read operation and the write operation on memory cells (not shown) of the semiconductor device 100.

The semiconductor device 100 may include a volatile memory device and a non-volatile memory device. For example, the volatile memory device may include a static random access memory (SRAM), a dynamic random access memory (DRAM), a synchronous DRAM (SDRAM), etc. For example, the non-volatile memory device may include a read only memory (ROM), a programmable ROM (PROM), an electrically erasable and programmable ROM (EEPROM), an erasable and programmable ROM (EPROM), a phase changeable RAM (PRAM), a magnetic RAM (MRAM), a resistive RAM (RRAM), a ferroelectric RAM (FRAM), etc.

Figure 2:
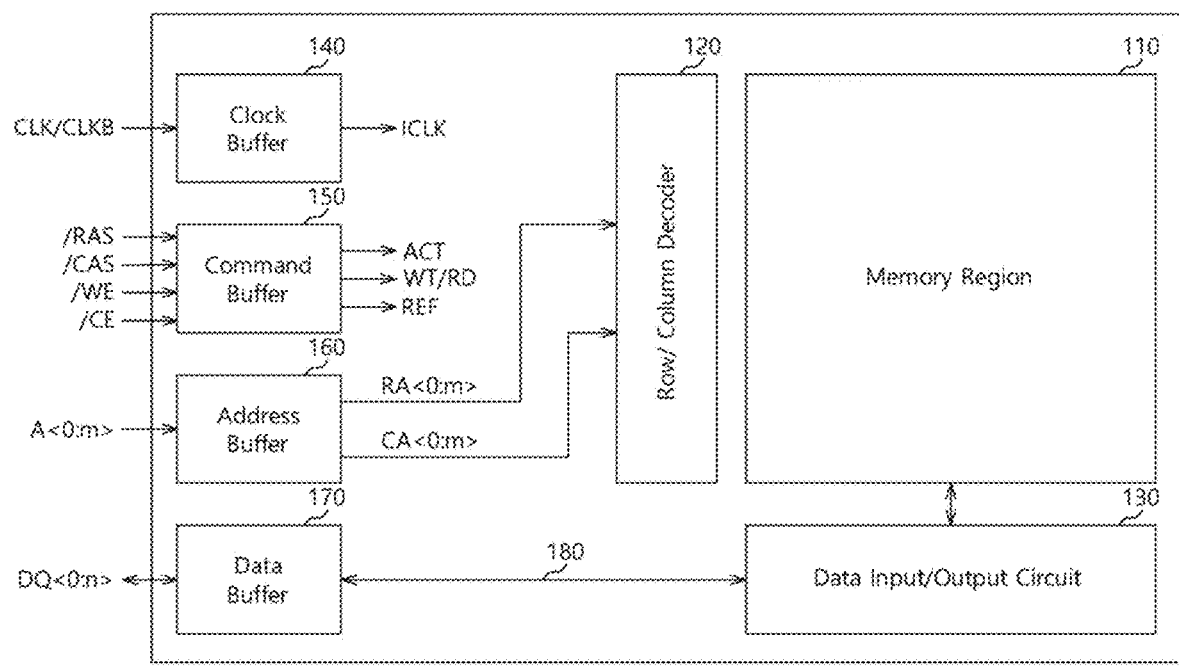
FIG. 2 is a block diagram illustrating a semiconductor device in accordance with an embodiment of the present disclosure.

FIG. 2 is a block diagram illustrating the semiconductor device 100 in FIG. 1.

Referring to FIG. 2, the semiconductor device 100 may include a memory region 110, a row/column decoder 120, a data input/output circuit 130, a clock buffer 140, a command buffer 150, an address buffer 160, and a data buffer 170. However, the configuration of the semiconductor device 100 is not limited to the above elements.

The memory region 110 may store the data transmitted from the controller 200. The memory region 110 may include a plurality of memory bank groups BG1 to BGm (See FIG. 3). Each of the memory bank groups BG1 to BGm may include a plurality of memory banks BANK1 to BANKn (See FIG. 3). Each of the memory banks BANK1 to BANKn may include a plurality of MATs MAT1 to MATi (See FIG. 4). Each of the MATs MAT1 to MATi may include a plurality of memory cells.

The memory cells in each of the MATs MAT1 to MATi may be connected to an intersection between a plurality of word lines (not shown) and a plurality of bit lines (not shown). Each of the memory cells may include a data storage element (not shown) for storing the data, and an access element (not shown) connected to the data storage element, the word line and the bit line. The access element may include a transistor. However, the present invention is not limited thereto. For example, the access element may include other elements in place of the transistor. Further, the data storage element may include a capacitor. However, the present invention is not limited thereto. For example, the data storage element may include other elements in place of the capacitor.

For example, when a word line of the plurality of word lines and a bit line of the plurality of bit lines are activated, the access element connected to the activated word line and the activated bit line may be turned-on. When the access element is turned-on, the data may be stored in a corresponding data storage element or read from the corresponding data storage element.

The semiconductor device 100 may perform various operations such as the write operation, the read operation, the refresh operation, etc., by the controls of the controller 200. The semiconductor device 100 may store the data received from the controller 200 in the memory region 110 during the write operation. The semiconductor device 100 may read the data stored in the memory region 110 and transmit the read data to the controller 200 during the read operation.

A length of the word line activated in the memory region 110 of the semiconductor device 100 may be changed. For example, a word line disposed in the memory region 110 may be formed to cross the plurality of MATs. The word line may be divided physically or logically by each of the plurality of MATs. The semiconductor device 100 may enable or disable a word line corresponding to each of the plurality of MATs by the control of the controller 200 to change the length of the activated word line. Herein, changing the length of the activated word line may mean changing a size of an activated page.

When the size of the activated page changes, an amount of simultaneously inputted/outputted data may also change. For example, when the size of the activated page increases, the amount of the simultaneously inputted/outputted data may also increase. In contrast, when the size of the activated page decreases, the amount of the simultaneously inputted/outputted data may also decrease.

The row/column decoder 120 may receive a row address signal RA<0:m> and a column address signal CA<0:m> from the address buffer 160. The row/column decoder 120 may decode the row address signal RA<0:m> and output a row selection signal. A word line corresponding to the row selection signal among the word lines may be activated. Further, the row/column decoder 120 may decode the column address signal CA<0:m> and output a column selection signal. A bit line corresponding to the column selection signal among the bit lines may be activated.

For example, the row/column decoder 120 may include a plurality of row decoders and a plurality of column decoders alternately and repeatedly arranged in a first direction. The first direction may be substantially parallel to an extending direction of the bit line, an arranging direction of the plurality of banks BANK1 to BANKn, or an arranging direction of the plurality of MATs MAT1 to MATi. The row/column decoder 120 may be illustrated in detail later with reference to drawings.

The data input/output circuit 130 may be connected between the data buffer 170 and the memory region 110. The data buffer 170 and the data input/output circuit 130 may be connected with each other through an internal data bus 180. When a write operation is performed on the memory region 110, the data input/output circuit 130 may store the data DATA, which is transmitted from the data buffer 170 through the internal data bus 180, in a specific memory cell of the memory region 110. When a read operation is performed on the memory region 110, the data input/output circuit 130 may output the data DATA, which is read from the specific memory cell of the memory region 110, to the data buffer 170 through the internal data bus 180.

Figure 3:
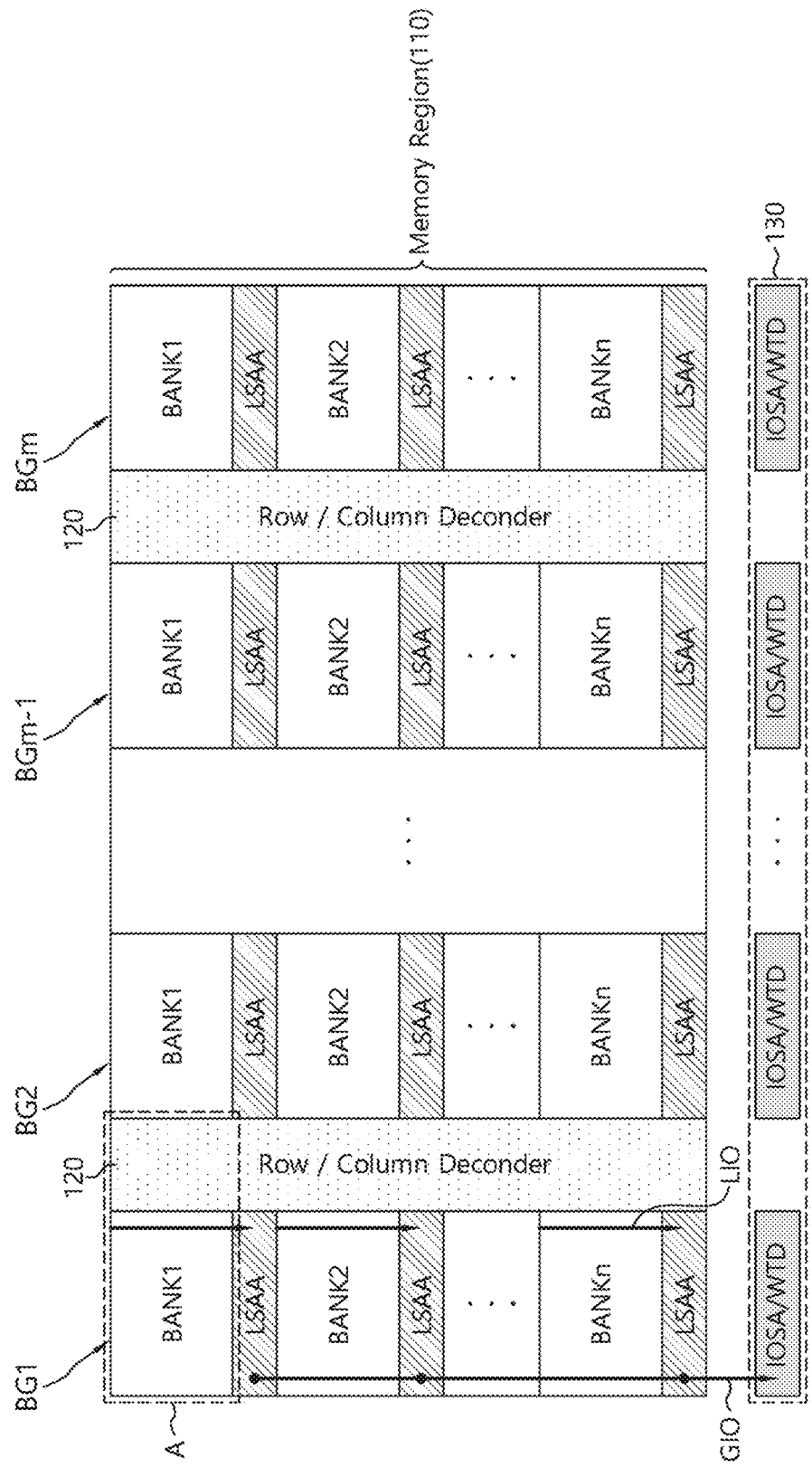
FIG. 3 is a view illustrating a memory region in FIG. 2.

The data input/output circuit 130 may include an input/output sense amplifier IOSA (See FIG. 3) and a write driver WTD (See FIG. 3). The input/output sense amplifier IOSA may transmit the data DATA read from the memory cells of the memory region 110 to the internal data bus 180. The write driver WTD may transmit the data DATA transmitted through the internal data bus 180 to the memory cells of the memory region 110. However, the data input/output circuit 130 may not be limited to the above-mentioned configuration.

The clock buffer 140 may receive system clock signals CLK and CLKB from the controller 200. The clock buffer 140 may buffer the system clock signals CLK and CLKB and generate an internal clock signal ICLK based on the buffered system clock signals CLK and CLKB. Although not shown in FIG. 2, the clock buffer 140 may include a delay circuit for controlling a phase and a timing of a clock, a delay fix loop circuit, etc. Since the clock buffer 140 may be well known to a skilled person in the art, any further illustrations with respect to the clock buffer 140 may be omitted herein for brevity.

The command buffer 150 may generate various internal command signals based on the commands CMDs received from the controller 200. For example, the controller 200 may change levels of a row address strobe signal /RAS, a column address strobe signal /CAS, a write enable signal /WE, and a chip enable signal /CE, and provide the changed levels of the row address strobe signal /RAS, the column address strobe signal /CAS, the write enable signal /WE, and the chip enable signal /CE to the command buffer 150 of the semiconductor device 100 such that the semiconductor device 100 performs a specific operation.

The command buffer 150 may generate an active signal ACT, a write signal WT, a read signal RD, a refresh signal REF, etc., based on the commands CMDs such as the row address strobe signal /RAS, the column address strobe signal /CAS, the write enable signal /WE, and the chip enable signal ICE received from the controller 200.

The active signal ACT may be a signal instructing an active operation for activating a word line in the memory region 110 selected based on an address signal A<0:m>. The write signal WT may be a signal instructing a write operation on the memory cells connected to the activated word line. The read signal RD may be a signal instructing a read operation on the memory cells connected to the activated word line. The refresh signal REF may be a signal instructing an auto refresh operation and/or a self-refresh operation of the semiconductor device 100.

The address buffer 160 may receive the address signal A<0:m> (where m is integer greater than or equal to 1) from the controller 200. The address signal A<0:m> may be information to access a specific memory cell. The address signal A<0:m> may include information of a word line and a bit line to be activated. The address buffer 160 may output a row address signal RA<0:m> and a column address signal CA<0:m> to the row/column decoder 120 based on the address signal A<0:m> received from the controller 200.

The data buffer 170 may receive data DQ<0:n> (where n is an integer greater than or equal to 1) transmitted from the controller 200 or output data read from the memory region 110 of the semiconductor device 100 to the controller 200.

Although not depicted in FIG. 2, the data buffer 170 may include a receiver and a transmitter. The receiver may receive the data DQ<0:n> transmitted from the controller 200 through an external data bus. The transmitter may output the data read from the memory region 110 to the external data bus.

Further, although not shown in FIG. 2, the data buffer 170 may receive and output a data strobe signal. The data strobe signal may be a signal synchronized with the data DQ<0:n>. The data strobe signal may be a signal used by the semiconductor device 100 to receive the data transmitted from the controller 200 or a signal used by the controller 200 to receive the data transmitted from the semiconductor device 100.

FIG. 3 is a view illustrating the memory region 110 in FIG. 2.

Referring to FIG. 3, the memory region 110 may include a plurality of memory bank groups BG1 to BGm and a plurality of row/column decoders 120. For example, the memory bank groups BG1 to BGm and the row/column decoders 120 may be disposed on the substantially the same plane. However, the present invention is not limited thereto. For example, the memory bank groups BG1 to BGm and the row/column decoders 120 may be disposed on different planes.

Each of the memory bank groups BG1 to BGm may include a plurality of memory banks BANK1 to BANKn and a plurality of local sense amplifier arrays LSAA. Each of the plurality of local sense amplifier arrays LSAA may be disposed under corresponding memory banks BANK1 to BANKn. For example, numbers of the local sense amplifier arrays LSAA may be substantially the same as numbers of the memory banks BANK1 to BANKn. However, the present invention is not limited thereto. For example, the numbers of the local sense amplifier arrays LSAA may be different from those of the memory banks BANK1 to BANKn. Each of the local sense amplifier arrays LSAA may sense and amplify data read from the memory cells of the corresponding memory banks BANK1 to BANKn and loaded on a local input/output line LIO. The local sense amplifier arrays LSAA may transmit the amplified data to a global input/output line GIO.

In order to transmit the data read from the memory cells of each of the memory banks BANK1 to BANKn and loaded onto the corresponding local sense amplifier arrays LSAA, each of the local input/output lines LIO may cross the corresponding memory banks BANK1 to BANKn and be connected to the local sense amplifier arrays LSAA. The global input/output line GIO may be electrically connected with the local sense amplifier arrays LSAA. Further, the global input/output line GIO may cross the memory bank group BG. The global input/output line may transmit the data transmitted from the local sense amplifier arrays LSAA to a corresponding input/output sense amplifier IOSA.

FIG. 3 shows the local input/output lines LIO and the global input/output line GIO with respect to the first memory bank group BG1. Local input/output lines LIO and a global input/output line GIO that are substantially the same as the local input/output lines LIO and the global input/output line GIO on the first memory bank group BG1 may be disposed on the second to mˆth memory bank groups BG2 to BGm.

In FIG. 3, the input/output sense amplifier IOSA and the write driver WTD are included in the data input/output circuit 130. However, the present disclosure is not limited thereto. For example, the input/output sense amplifier IOSA and the write driver WTD may be disposed between the memory region 110 and the data input/output circuit 130.

The input/output sense amplifier IOSA and the write driver WTD may be provided to each of the memory bank groups BG1 to BGm, as shown in FIG. 3. However, the present disclosure is not limited thereto. For example, the input/output sense amplifier IOSA and the write driver WTD provided for each of the memory bank groups BG1 to BGm may be connected to the global input/output line GIO extending across each of the memory bank groups BG1 to BGm. The memory banks BANK1 to BANKn in each of the memory bank groups BG1 to BGm may commonly use a pair of the input/output sense amplifier IOSA and the write drive WTD.

The input/output sense amplifier IOSA may sense and amplify the data DATA in the global input/output line GIO while performing the read operation on the memory region 110. The input/output sense amplifier IOSA may transmit the amplified data to the internal data bus 180. The write driver WTD may transmit the data DATA in the internal data bus 180 to the global input/output line GIO while performing the write operation on the memory region 110.

For example, the data read from the memory cells of each of the memory banks BANK1 to BANKn may be amplified to be equal to or greater than a specific level by a corresponding local sense amplifier array LSAA. The amplified data may be transmitted to the input/output sense amplifier IOSA through the global input/output line GIO. The input/output sense amplifier IOSA may sense and amplify the amplified data transmitted through the global input/output line GIO and transmit the amplified data to the internal data bus 180 (See FIG. 2).

Referring again to FIG. 3, each of the row/column decoders 120 may be disposed between a pair of the memory bank groups, for example, the first memory bank group BG1 and the second memory bank group BG2. The row/column decoders 120 may be disposed to extend in a direction substantially parallel to an arranging direction of the memory banks BANK1 to BANKn. In FIG. 2, the row/column decoder 120 may be separated from the memory region 110 for convenience of explanation. Further, in FIG. 3, the row/column decoder 120 may be disposed in the memory region 110. However, the location of the row/column decoder 120 may not be limited to a specific location and may be placed elsewhere depending on design.

Figure 4:
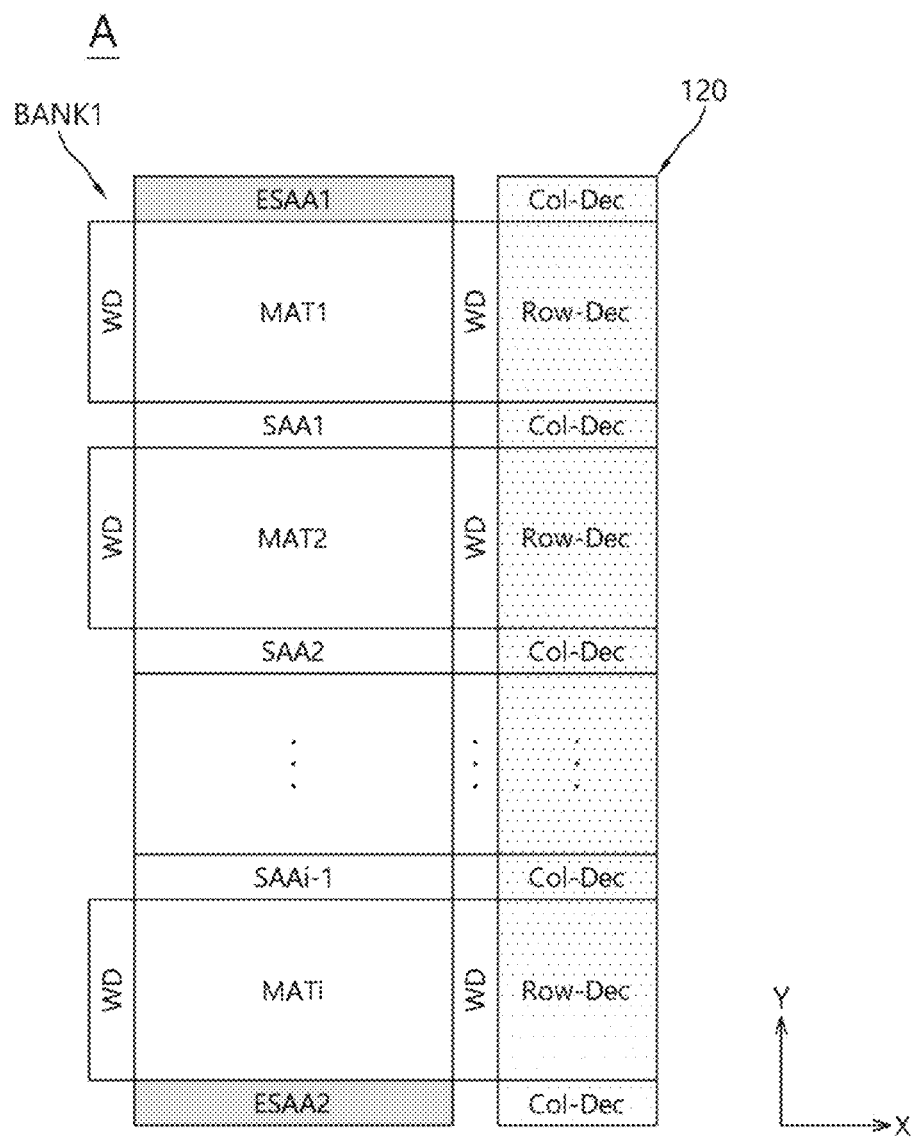
FIG. 4 is a view illustrating a portion "A" in FIG. 3.

FIG. 4 is a view illustrating a portion "A" in FIG. 3. FIG. 4 shows an example of the first memory bank BANK1 of FIG. 3. The memory banks other than the first memory bank BANK1 in FIG. 3 may have a configuration substantially the same as that of the first memory bank BANK1 described in FIG. 4.

Referring to FIG. 4, the first memory bank BANK1 may include a plurality of MATs MAT1 to MATi, a plurality of sense amplifier arrays SAA1 to SAAi−1, and a plurality of edge sense amplifier arrays ESAA1 and ESAA2.

Although not shown in FIG. 4, each of the MATs MAT1 to MATi may include a plurality of word lines extending in an X-direction, and a plurality of bit lines extending in a Y-direction. The MATs MAT1 to MATi may include a plurality of memory cells connected to an intersection between the plurality of word lines and the plurality of bit lines. The plurality of memory cells may store data. Word line drivers WD may be disposed at both sides of the plurality of MATs MAT1 to MATi.

The word line driver WD may be configured to drive a word line selected by a row selection signal among the word lines in each of the plurality of MATs MAT1 to MATi. In FIG. 4, the two word line drivers may be arranged at the both sides of each of the MATs MAT1 to MATi along the X-direction. However, the position and the number of the word line driver WD may not be limited to a specific location and a specific number. A technology for driving the word line may have no direct relation to a main feature of the present invention. Since the technology for driving the word line is well known to those skilled in the art, any further illustrations with respect to the word line driver WD may be omitted herein for brevity.

In FIG. 4, one memory bank may include one MAT array in which the MATs MAT1 to MATi may be stacked in the Y-direction. However, the present invention is not limited thereto. For example, one memory bank may include a plurality of MAT arrays.

The sense amplifier arrays SAA1 to SAAi-1 may be arranged between the adjacent MATs MAT1 to MATi. For example, the sense amplifier arrays SAA1 to SAAi-1 may be arranged between the first MAT1 and the second MAT2 to between the (i-1)^th MAT and (i)^th MAT.

Therefore, numbers of the sense amplifier arrays SAA1 to SAAi-1 in the first memory bank BANK1 may be fewer than numbers of the MATs MAT1 to MATi. That is, as shown in FIG. 4, when the number of the MATs MAT1 to MATi in the first memory bank BANK1 may be (i), the number of the sense amplifier arrays SAA1 to SAAi-1 may be (i-1). Here, 'i' may be an integer greater than or equal to 2.

Each of the sense amplifier arrays SAA1 to SAAi-1 may be connected with the bit lines in the adjacent MATs MAT1 to MATi. For example, the first sense amplifier arrays SAA1 between the first MAT MAT1 and the second MAT MAT2 may be connected with a part of the bit lines in the first MAT MAT1 and a part of the bit lines in the second MAT MAT2. This structure may be referred to as an open bit line structure. The first sense amplifier array SAA1 may sense and amplify a voltage difference between the part of the bit lines in the first MAT MAT1 and the part of the bit lines in the second MAT MAT2.

Although not shown in FIG. 4, each of the sense amplifier arrays SAA1 to SAAi-1 may include a plurality of sense amplifiers SA. Each of the sense amplifiers SA may be connected to one bit line among the part of the bit lines in the first MAT MAT1, for example, a positive bit line, and one bit line among the part of the bit lines in the second MAT MAT2, for example, a negative bit line.

The edge sense amplifier arrays ESAA1 and ESAA2 may be respectively arranged over the uppermost first MAT MAT1 and under the lowermost (i)^th MAT MATi among the MATs MAT1 to MATi of the first memory bank BANK1. The edge sense amplifier arrays ESAA1 and ESAA2 may include a first edge sense amplifier array ESAA1 arranged over the first MAT MAT1, and a second edge sense amplifier array ESAA2 arranged under the (i)^th MAT MATi.

Thus, the first edge sense amplifier array ESAA1 may be arranged over the uppermost first MAT MAT1 of the first memory bank BANK1. The first sense amplifier array SAA1 may be arranged under the uppermost first MAT MAT1 of the first memory bank BANK1. The second sense amplifier array SAA2 may be arranged under the second MAT MAT2 of the first memory bank BANK1. The (i-1)^th sense amplifier array SAAi-1 may be arranged over the lowermost (i)th MAT MATi of the first memory bank BANK1. The second edge sense amplifier arrays ESAA2 may be arranged under the lowermost (i)th MAT MATi of the first memory bank BANK1.

Because the first edge sense amplifier array ESAA1 may be arranged over the first memory bank BANK1 and the second edge sense amplifier array ESAA2 may be arranged under the first memory bank BANK1, it may not be required to form a dummy MAT at an edge portion of the first memory bank BANK1 along the Y-direction.

The first edge sense amplifier array ESAA1 may be connected to a part of the bit lines in the first MAT MAT1.

The second edge sense amplifier array ESAA2 may be connected to a part of the bit lines in the (i)^th MAT MATi. For example, the bit lines in the first MAT MAT1 may include first bit lines connected to the first sense amplifier array SAA1 and second bit lines connected to the first edge sense amplifier array ESAA1. The bit lines in the (i)^th MAT MATi may include first bit lines connected to the (i-1)^th sense amplifier array SAAi-1 and second bit lines connected to the second edge sense amplifier array ESAA2.

Each of the first edge sense amplifier array ESAA1 and the second edge sense amplifier array ESAA2 may include a plurality of edge sense amplifiers ESA (not shown). The edge sense amplifier ESA in the first and second edge sense amplifier arrays ESAA1 and ESAA2 may have a structure different from that of the sense amplifier SA in the first to (i)^th sense amplifier arrays SAA1 to SAAi-1. The structural differences and operational differences between the sense amplifier SA and the edge sense amplifier may be illustrated later with reference to following figures.

Referring again to FIG. 4, the row/column decoder 120 may include a plurality of row decoders Row-Dec and a plurality of column decoders Col-Dec arranged in a direction substantially parallel to an arranging direction of the MATs MAT1 to MATi of the first memory bank BANK1. The row decoders Row-Dec and the column decoders Col-Dec may be arranged alternately and repeatedly.

For example, each of the row decoders Row-Dec may be aligned with the corresponding MATs MAT1 to MATi in the X-direction. Each of the column decoders Col-Dec may be aligned with the corresponding sense amplifier arrays SAA1 to SAAi-1 and the first and second edge sense amplifier arrays ESAA1 and ESAA2 in the X-direction. The row decoders Row-Dec and the column decoders Col-Dec may be alternately arranged in the Y-direction.

Row selection signal lines for transmitting row selection signals outputted from each of the row decoders Row-Dec may extend in the X-direction. Column selection signals for transmitting column selection signals outputted from each of the column decoders Col-Dec may extend in the X-direction. Thus, the row selection signals and the column selection signals may be substantially parallel to each other. The column selection signal lines may cross the sense amplifier arrays SAA1 to SAAi-1, and the first and second edge sense amplifier arrays ESAA1 and ESAA2 in the X-direction.

Figure 5:
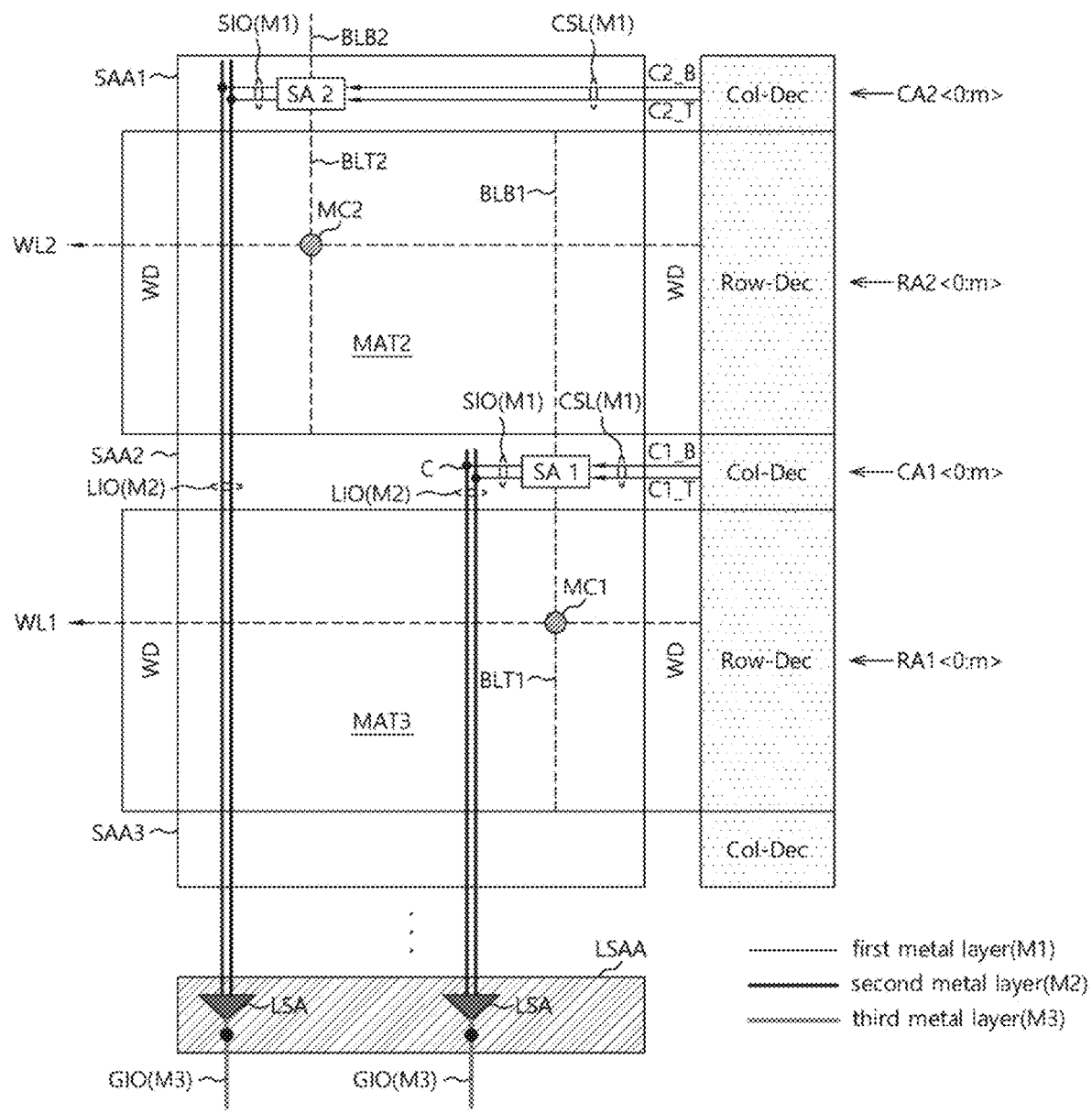
FIG. 5 is a plan layout view illustrating a column selection signal line and data input/output lines SIO, LIO, and GIO in accordance with an embodiment of the present disclosure.

FIG. 5 is a plan layout view illustrating a column selection signal line and data input/output lines SIO, LIO, and GIO in accordance with an embodiment of the present disclosure. Specifically, FIG. 5 shows arrangement relations between a column selection signal line and data input/output lines SIO, LIO and GIO. In FIG. 5, a first metal layer M1 may represent a lowermost line, a second metal layer M2 may represent lines on the first metal layer M1, and a third metal layer M3 may represent an uppermost line. For convenience of explanations, FIG. 5 shows the second MAT MAT2, the third MAT MAT3, the first to third sense amplifier arrays SAA1 to SAA3 and one local sense amplifier array LSAA.

Referring to FIG. 5, a first row address signal RA1<0:m> and a first column address signal CA1<0:m> outputted from the address buffer 160 (See FIG. 2) may be inputted into the corresponding row decoder Row-Dec and the corresponding column decoder Col-Dec.

The row decoder Row-Dec may decode the inputted first row address signal RA1<0:m> to output a row selection signal for activating the first word line WL1 among the word lines of the first MAT MAT1. The word line driver WD may drive the first word line WL1 selected by the row selection signal outputted from the row decoder Row-Dec.

The column decoder Col-Dec may decode the inputted first column address signal CA1<0:m> to output first column selection signals C1_T and C1_B for activating a first bit line BLT1 among the bit lines in the third MAT MAT3 and a first complementary bit line BLB1 among the bit lines in the second MAT MAT2.

The first column selection signals C1_T and the C1_B may be inputted into a sense amplifier SA1 of the second sense amplifier array SAA2 between the second MAT MAT2 and the third MAT MAT3 through column selection signal lines CSL crossing the second sense amplifier array SAA2. The sense amplifier SA1 may amplify a voltage of the first bit line BLT1 and a voltage of the first complementary bit line BLB1 to a level greater than or equal to a first level. The sense amplifier SA1 may transmit the amplified voltages of the first bit line BLT1 and the first complementary bit line BLB1 to corresponding segment input/output lines SIO through channels formed by inputting the first column selection signals C1_T and C1_B.

As shown in FIG. 5, the column selection signal lines CSL for transmitting the column selection signals and the segment input/output lines SIO for receiving the voltages amplified to a level greater than or equal to the first level by the sense amplifier SA1 may correspond to the first metal layer M1. In example embodiments, the column selection signal lines CSL and the segment input/output lines SIO may be positioned on a same plane. The column selection signal lines CSL and the segment input/output lines SIO may be extended parallel to each other. For example, the column selection signal lines CSL and the segment input/output lines SIO may be extended in a direction substantially parallel to the first word line WL1.

The segment input/output lines SIO may transmit the voltages of the first bit line BLT1 and the first complementary bit line BLB1 amplified to a level greater than or equal to the first level by the sense amplifier SA1 to corresponding local input/output lines LIO. The segment input/output lines SIO and the local input/output lines LIO may be electrically connected with each other via a contact C.

The local input/output lines LIO may be extended in a direction substantially perpendicular to the column selection signal lines CSL and the segment input/output lines SIO. That is, the local input/output lines LIO may be extended in a direction substantially parallel to the bit lines BLT1 and BLB1. The local input/output lines LIO may correspond to the second metal layer M2 arranged on a plane higher than a plane on which the column selection signal lines CSL and the segment input/output lines SIO may be positioned. The local input/output lines LIO may transmit the voltages of the first bit line BLT1 and the first complementary bit line BLB1 amplified to a level greater than or equal to the first level to the local sense amplifier array LSAA.

The voltages of the first bit line BLT1 and the first complementary bit line BLB1 transmitted through the local input/output lines LIO may be inputted into the corresponding local sense amplifier LSA among the local sense amplifiers LSA in the local sense amplifier array LSAA. The local sense amplifier LSA may amplify the voltages of the first bit line BLT1 and the first complementary bit line BLB1, which have a level greater than or equal to the first level, to a level greater than or equal to a second level. The local sense amplifier LSA may transmit the amplified voltages of the first bit line BLT1 and the first complementary bit line BLB1 that have a level greater than or equal to the second level to the global input/output line GIO. The global input/output line GIO may correspond to the third metal layer M3 arranged over the local input/output lines LIO.

The global input/output line GIO may transmit the amplified voltages of the first bit line BLT1 and the first complementary bit line BLB1 that have a level greater than or equal to the second level to the input/output sense amplifier IOSA (See FIG. 3). In FIG. 5, the two local input/output lines LIO may be connected to an input terminal of the local sense amplifier LSA and one global input/output line GIO may be connected to an output terminal of the local sense amplifier LSA. However, the present invention is not limited thereto. For example, the global input/output lines GIO, the number of which is substantially the same as the numbers of the local input/output lines LIO, may be respectively connected with the output terminals of the local sense amplifiers LSA.

The input/output sense amplifier IOSA may sense a voltage difference between the first bit line BLT1 and the first complementary bit line BLB1 that have a level greater than or equal to the second level. The input/output sense amplifier IOSA may amplify the voltage difference to a level greater than or equal to a third level. The input/output sense amplifier IOSA may transmit the amplified voltage difference between the first bit line BLT1 and the first complementary bit line BLB1 that have a level greater than or equal to the third level to the internal data bus 180 (See FIG. 2). The voltage transmitted from the input/output sense amplifier IOSA may correspond to data read from a first memory cell MC1 of the third MAT MAT3.

Referring again to FIG. 5, a second row address signal RA2<0:m> and a second column address signal CA2<0:m> outputted from the address buffer 160 (See FIG. 2) may be inputted into the corresponding row decoder Row-Dec and the corresponding column decoder Col-Dec, respectively.

The row decoder Row-Dec may decode the inputted second row address signal RA2<0:m> to output a row selection signal for activating the second word line WL2 among the word lines of the second MAT MAT2. The word line driver WD may drive the second word line WL2 selected by the row selection signal outputted from the row decoder Row-Dec.

The column decoder Col-Dec may decode the inputted second column address signal CA2<0:m> to output second column selection signals C2_T and C2_B for activating a second bit line BLT2 among the bit lines in the second MAT MAT2.

The second column selection signals C2_T and the C2_B may be inputted into a sense amplifier SA2 of the first sense amplifier array SAA1 through the column selection signal lines CSL crossing the first sense amplifier array SAA1. The sense amplifier SA2 may amplify a voltage of the second bit line BLT2 and a voltage of a second complementary bit line BLB2 to a level greater than or equal to a first level. The sense amplifier SA2 may transmit the amplified voltages of the second bit line BLT2 and the second complementary bit line BLB2 to the corresponding segment input/output lines SIO through channels formed by inputting the second column selection signals C2_T and C2_B.

The segment input/output lines SIO may transmit the voltages of the second bit line BLT2 and the second complementary bit line BLB2 amplified to a level greater than or equal to the first level to the corresponding local input/output lines LIO. The local input/output lines LIO may transmit the voltages of the second bit line BLT2 and the second complementary bit line BLB2 amplified to a level greater than or equal to the first level to the local sense amplifier LSA.

The local sense amplifier LSA may amplify the voltages of the second bit line BLT2 and the second complementary bit line BLB2, which have a level greater than or equal to the first level, to a level greater than or equal to a second level. The local sense amplifier LSA may transmit the amplified voltages of the second bit line BLT2 and the second complementary bit line BLB2 that have a level greater than or equal to the second level to the global input/output line GIO. The global input/output line GIO may transmit a difference between the amplified voltages of the second bit line BLT2 and the second complementary bit line BLB2 that have a level greater than or equal to the second level to the input/output sense amplifier IOSA.

The input/output sense amplifier IOSA may sense a voltage difference between the second bit line BLT2 and the second complementary bit line BLB2 that have a level greater than or equal to the second level. The input/output sense amplifier IOSA may amplify the voltage difference to a level greater than or equal to a third level. The input/output sense amplifier IOSA may transmit the amplified voltage difference between the second bit line BLT2 and the second complementary bit line BLB2 that have a level greater than or equal to the third level to the internal data bus 180. The voltage transmitted from the input/output sense amplifier IOSA may correspond to data read from a second memory cell MC2 of the second MAT MAT2.

Figure 6:
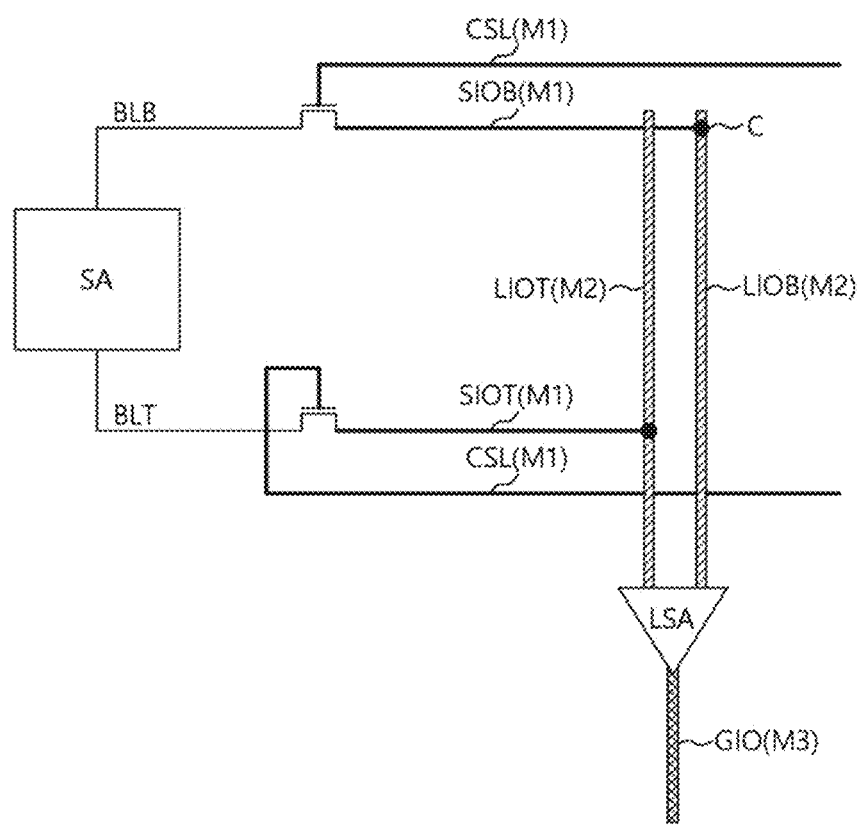
FIG. 6 is a view illustrating connection relations between a sense amplifier, a bit line, a column selection signal line, and data input/output lines in accordance with an embodiment of the present disclosure.

FIG. 6 is a view illustrating connection relations between the sense amplifier SA, the bit lines BLT and BLB, the column selection signal line CSL and the data input/output lines SIO and LIO.

Referring to FIG. 6, the sense amplifier SA may be connected to a bit line BLT and a complementary bit line BLB. The bit line BLT and the complementary bit line BLB may be connected to segment input/output lines SIOT and SIOB through a switching element such as a transistor. The column selection signal lines CSL may be connected to an input terminal of the switching element, i.e., a gate of the transistor. Thus, when a logic signal 'high' may be inputted through the column selection signal lines CSL, the switching element may be turned-on to form channels between the bit line BLT and the segment input/output line SIOT and between the complementary bit line BLB and the segment input/output line SIOB.

The column selection signal lines CSL, which may be connected to the segment input/output lines SIOT and SIOB and the gate of the transistor, may correspond to the lowermost first metal layer M1. The segment input/output lines SIOT and the SIOB and the column selection signal lines CSL may be extended parallel to each other.

Local input/output lines LIOT and LIOB connected to the segment input/output lines SIOT and SIOB through a contact C may correspond to the second metal layer M2 on the first metal layer M1. The local input/output lines LIOT and LIOB may be extended in a direction substantially perpendicular to the segment input/output lines SIOT and SIOB and the column selection signal lines CSL. The local input/output lines LIOT and LIOB may be connected to an input terminal of the local sense amplifier LSA. An output terminal of the local sense amplifier LSA may be connected to the global input/output line GIO. The global input/output line GIO may correspond to the third metal line M3 on the second metal layer M2.

Because the column selection signal lines CSL may be substantially coplanar with the segment input/output lines SIO, and the column selection signal lines CSL and the segment input/output lines SIO may be extended along the same direction, numbers of the local input/output lines LIO that can be disposed on the MAT may be increased to equal to numbers of the column selection signal lines CLS or a number greater than the number of the column selection signal lines CLS. Therefore, an amount of the data simultaneously inputted/outputted into/from one MAT may also be increased.

Further, because an amount of the data greater than or equal to the data that is inputted/outputted by driving conventional MATs may be inputted/outputted by driving one MAT, the semiconductor device may have lower power consumption and improved operational speed.

Figure 7A:
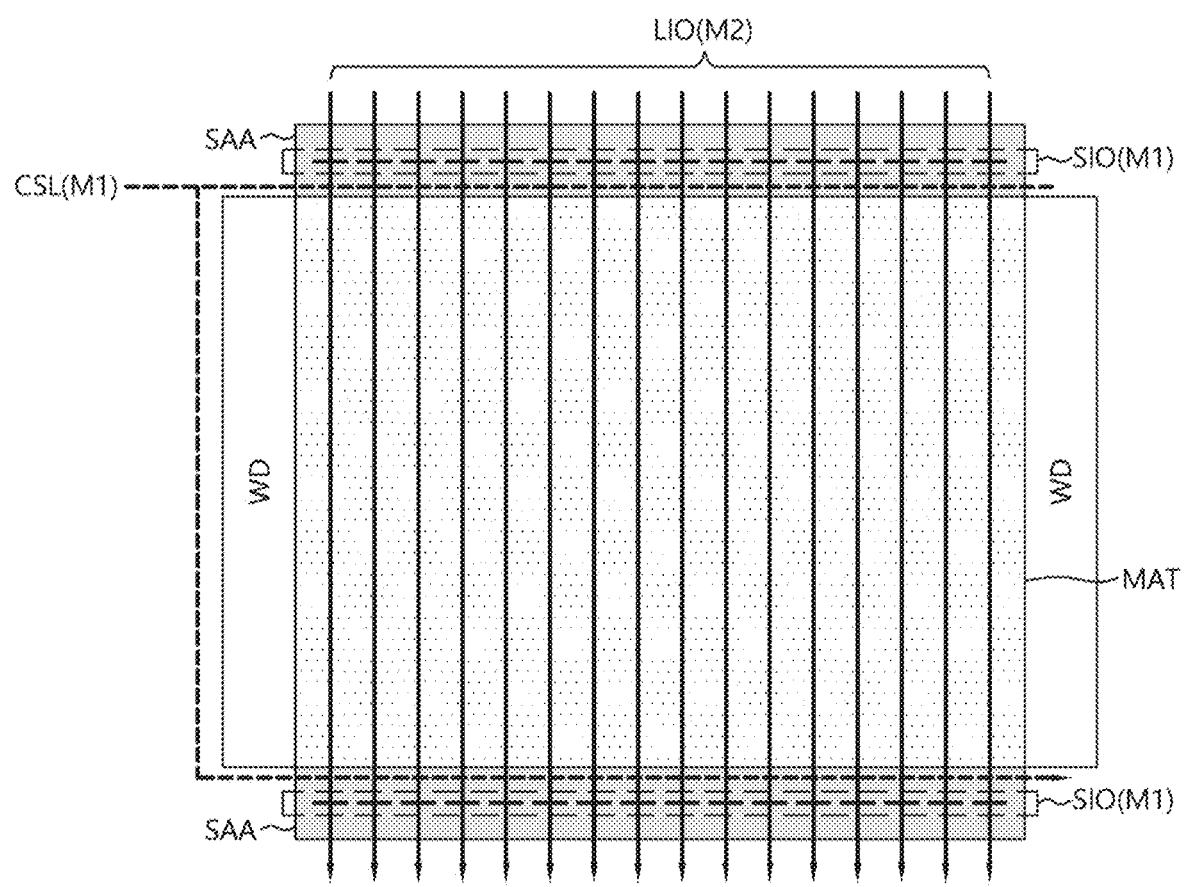

FIG. 7A is a view illustrating the segment input/output line SIO, the local input/output line LIO, and the column selection signal line CSL. Although not shown in FIG. 7A, the segment input/output line SIO may include the segment input/output line SIOT connected to the bit line BLT (See FIG. 6) and the segment input/output line SIOB connected to the complementary bit line BLB (See FIG. 6). Further, the at least one sense amplifier SA (See FIG. 6) may be connected to one segment input/output line SIO through a switching element.

Referring to FIG. 7A, the segment input/output line SIO may cross the sense amplifier array SAA. The segment input/output line SIO may be divided into a plurality of lines. Numbers of the divided lines of the segment input/output line SIO may be changed in accordance with the type of the semiconductor device.

For example, the numbers of the divided lines of the segment input/output lines SIO may be changed in accordance with the amount of the data simultaneously inputted/outputted into/from one MAT. That is, the divided numbers of the segment input/output line SIO may be increased in proportion to increasing of the data amount simultaneously inputted/outputted into/from one MAT. In contrast, the divided numbers of the segment input/output line SIO may be decreased in proportion to decreasing of the data amount simultaneously inputted/outputted into/from one MAT.

The column selection signal line CSL may cross the sense amplifier array SAA similar to how the segment input/output line SIO crosses the sense amplifier array SAA. In other words, the column selection signal line CSL may be substantially parallel to the segment input/output line SIO.

The local input/output line LIO may be extended in a direction substantially perpendicular to the column selection signal line CSL and the segment input/output line SIO. The local input/output line LIO may be connected with the segment input/output line SIO through a contact (for example, contact C in FIG. 5 and FIG. 6). The local input/output line LIO may receive the data from the segment input/output line SIO through the contact.

As mentioned above, when the segment input/output line SIO is divided into the lines, numbers of the local input/output lines LIO may be substantially the same as the numbers of the divided lines of the segment input/output line SIO. That is, the local input/output lines LIO may respectively correspond to the divided lines of the segment input/output line SIO.

Referring again to FIG. 7A, the column selection signal line CSL and the segment input/output line SIO may correspond to a metal layer M1 formed on a substantially same plane. The local input/output line LIO may correspond to a metal layer M2 positioned on a plane higher than the plane on which the column selection signal line CSL and the segment input/output line SIO may be located. The column selection signal line CSL and the segment input/output line SIO may be extended on the sense amplifier array SAA in a first direction, for example, an extending direction of the word line. The local input/output line LIO may be extended on the sense amplifier array SAA and the MAT in a second direction, for example, an extending direction of the bit line.

Figure 7B:
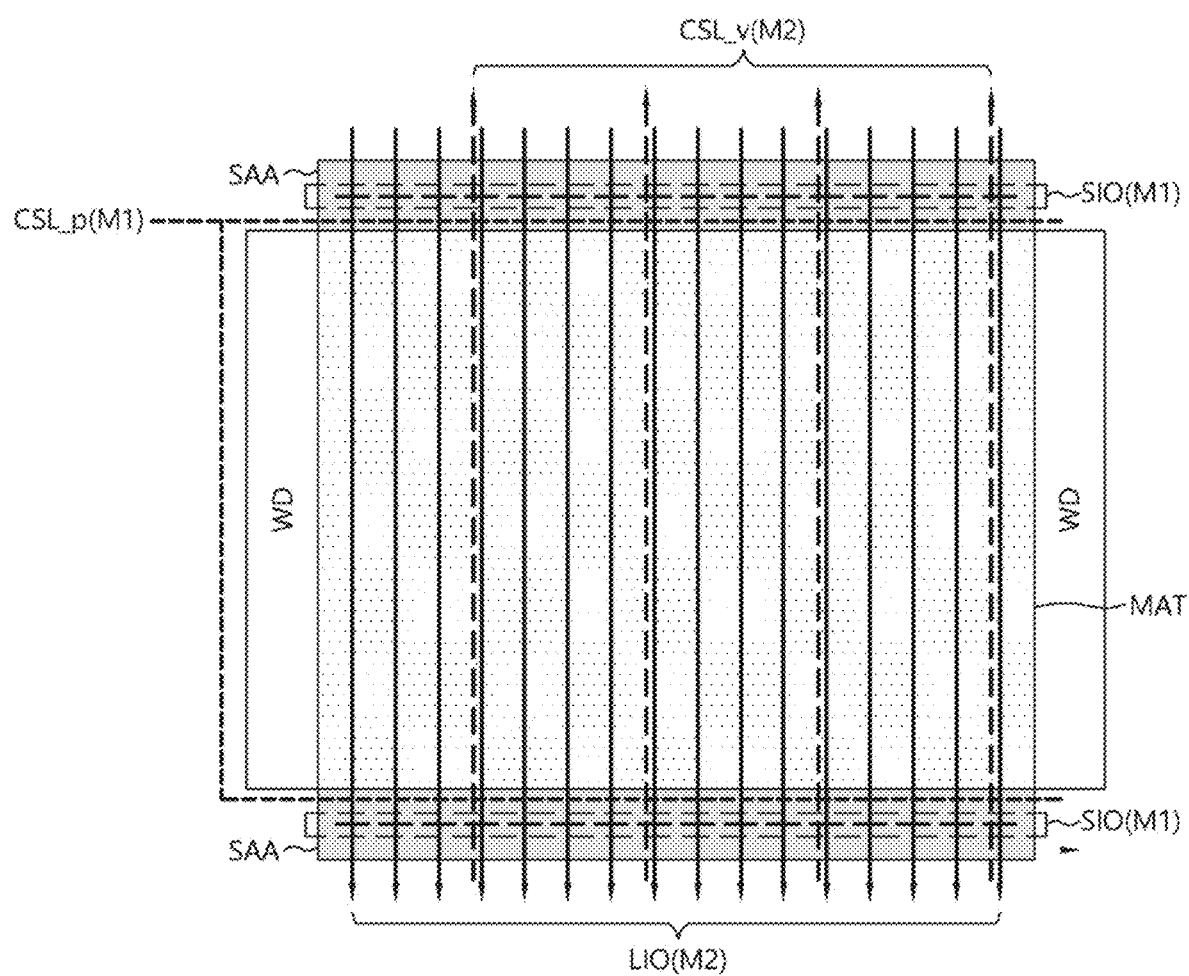

FIG. 7B is a view illustrating the segment input/output line SIO, the local input/output line LIO and the column selection signal line CSL. For convenience of explanations, any further illustrations with respect to elements substantially the same as those in FIG. 7A may be omitted herein for brevity.

Referring to FIG. 7B, the segment input/output line SIO may be extended on the sense amplifier array SAA in the first direction, for example, the extending direction of the word line. The segment input/output line SIO may be divided into a plurality of lines.

The local input/output line LIO may be extended on the sense amplifier array SAA and the MAT in the second direction, for example, the extending direction of the bit line. The local input/output line LIO may be connected with the segment input/output line SIO through the contact.

The column selection signal line CSL may include a first column selection signal line CSL_p extended on the sense amplifier array SAA in the first direction, and a second column selection signal line CSL_v extended on the MAT in the second direction.

The first column selection signal line CSL_p may correspond to the metal layer M1 substantially coplanar with the segment input/output line SIO. The second column selection signal line CSL_v may correspond to the metal layer M2 substantially coplanar with the local input/output line LIO. Thus, the first column selection signal line CSL_p may be arranged on a level lower than that on which the second column selection signal line CSL_v may be positioned.

FIG. 7C is a view illustrating the segment input/output line SIO, the local input/output line LIO, and the column selection signal line CSL. For convenience of explanation and brevity, any further illustrations with respect to elements substantially the same or overlapping as those in FIGS. 7A and 7B are omitted herein.

Referring to FIG. 7C, the segment input/output line SIO may be extended on the sense amplifier array SAA in the first direction. The segment input/output line SIO may be divided into a plurality of lines.

The column selection signal line CSL and the local input/output line LIO may be extended on the sense amplifier array SAA and the MAT in the second direction. Thus, the column selection signal line CSL and the local input/output line LIO may be substantially perpendicular to the segment input/output line SIO. The column selection signal line CSL and the local input/output line LIO may correspond to the metal layer M2 on a substantially same plane. The segment input/output line SIO may correspond to the metal layer M1 arranged on a level lower than that on which the column selection signal line CSL and the local input/output line LIO may be positioned.

The column selection signal line CSL may transmit first column selection signals CYi_1 among the column selection signals to the sense amplifier array SAA in response to a first enable signal E1. The column selection signal line CSL may transmit second column selection signals CYi_2 among the column selection signals to the sense amplifier array SAA in response to a second enable signal E2.

The segment input/output line SIO may sequentially transmit data, for example, first data read by inputting the first column selection signals CYi_1, and data, for example, second data read by inputting the second column selection signals CYi_2 to the local input/output line LIO. That is, the first data and the second data may be sequentially transmitted to one local input/output line LIO. The first data and the second data transmitted to the local input/output line LIO may be sequentially stored in a first data register D1 and a second data register D2 of an additional data register DR (See FIG. 8). The first and second data may be simultaneously outputted from the data register DR.

FIG. 8 is a view illustrating the data register DR.

Referring to FIG. 8, the data register DR may be connected with the local input/output line LIO. The data register DR may include registers corresponding to each of the local input/output lines LIO. The first data D1 and the second data D2 may be stored in the registers corresponding to the local input/output lines LIO.

As mentioned above, the first data D1 may correspond to data read by inputting the first column selection signals CYi_1. The second data D2 may correspond to data read by inputting the second column selection signal CYi_2. The first data D1 and the second data D2 may be sequentially transmitted through one local input/output line LIO. The transmitted first and second data D1 and D2 may be stored in the data register DR. The first data D1 and the second data D2 in the data register DR may be simultaneously outputted as one data D.

The data D outputted from the data register DR may be inputted into the local sense amplifier array LSAA (See FIG. 5). However, the data D may be inputted into other elements.

Figure 9:
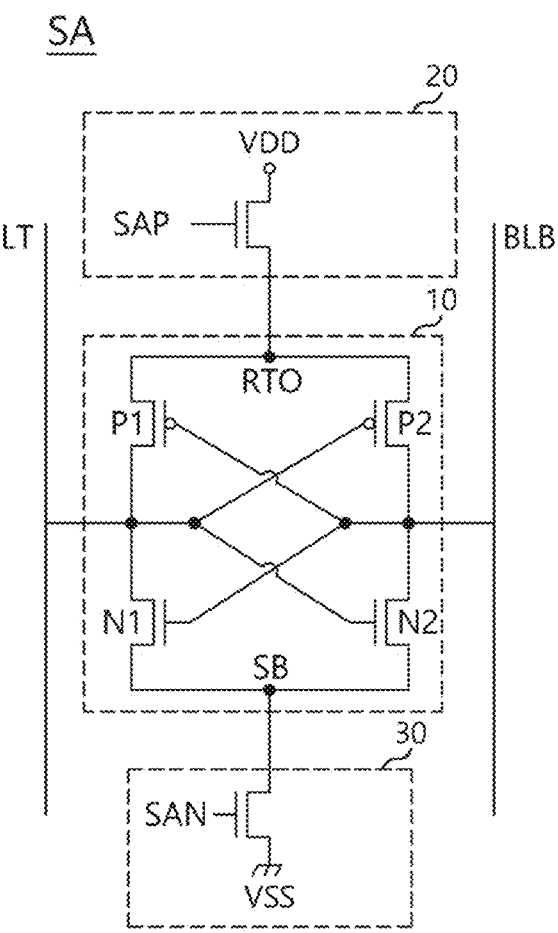
FIG. 9 is a circuit diagram illustrating a normal sense amplifier.

FIG. 9 is a circuit diagram illustrating the normal sense amplifier SA.

Referring to FIG. 9, the normal sense amplifier SA may include a detection amplifier 10, a pull-up controller 20, and a pull-down controller 30. The detection amplifier 10 may detect and amplify a voltage difference between the positive bit line BLT and the negative bit line BLB. The pull-up controller 20 may provide the detection amplifier 10 with a pull-up voltage. The pull-down controller 30 may provide the detection amplifier 10 with a pull-down voltage.

The detection amplifier 10 may include two PMOS transistors P1 and P2, and two NMOS transistors N1 and N2. For example, when the voltage level of the positive bit line BLT may be higher than the voltage level of the negative bit line BLB, the PMOS transistor P1 and the NMOS transistor N2 may be turned-on and the PMOS transistor P2 and the NMOS transistor N1 may be turned-off. The voltage level of the positive bit line BLT may be amplified to a level of a power voltage VDD by a pull-up power supply terminal RTO. The voltage level of the negative bit line BLB may be amplified to a level of a ground voltage VSS by a pull-down power supply terminal SB.

The pull-up controller 20 may provide the pull-up power supply terminal RTO of the detection amplifier 10 with the power voltage VDD in response to a pull-up amplification activation signal SAP. The pull-down controller 30 may provide the pull-down power supply terminal SB of the detection amplifier 10 with the ground voltage VSS in response to a pull-down amplification activation signal SAN. The pull-up amplification activation signal SAP and the pull-down amplification activation signal SAN may be inactivated when a pre-charge operation. In contrast, the pull-up amplification activation signal SAP and the pull-down amplification activation signal SAN may be activated when an active operation.

The positive bit line BLT and the negative bit line BLB connected to the detection amplifier 10 may be pre-charged with a substantially same voltage at a normal state. When an arbitrary word line is enabled, a cell transistor connected to the word line may be turned-on. Data in a capacitor may be transmitted to the positive bit line BLT through a channel of the turned-on transistor. This operation may be referred to as a charge sharing. The voltage level of the negative bit line BLB may be maintained. In contrast, the voltage level of the positive bit line BLT may be changed by the charge sharing.

The pull-up amplification activation signal SAP and the pull-down amplification activation signal SAN may be activated to a high level when the active operation. The power voltage VDD and the ground voltage VSS may be supplied to the pull-up power supply terminal RTO and the pull-down power supply terminal SB of the detection amplifier 10, respectively, by the pull-up amplification activation signal SAP and the pull-down amplification activation signal SAN. The level of the power supply VDD and the level of the ground voltage VSS may be provided to the pull-up power supply terminal RTO and the pull-down power supply terminal SB, respectively, so that the voltage difference between the positive bit line BLT and the negative bit line BLB may be amplified.

Figure 10A:
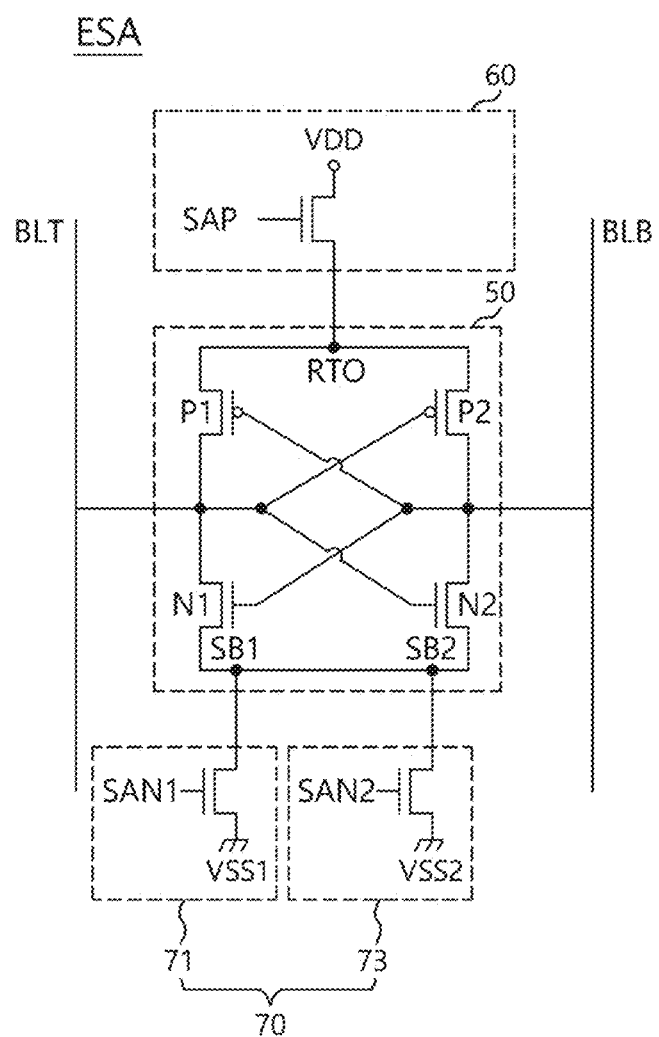
FIG. 10A is a circuit diagram illustrating an edge sense amplifier.
Figure 10B:
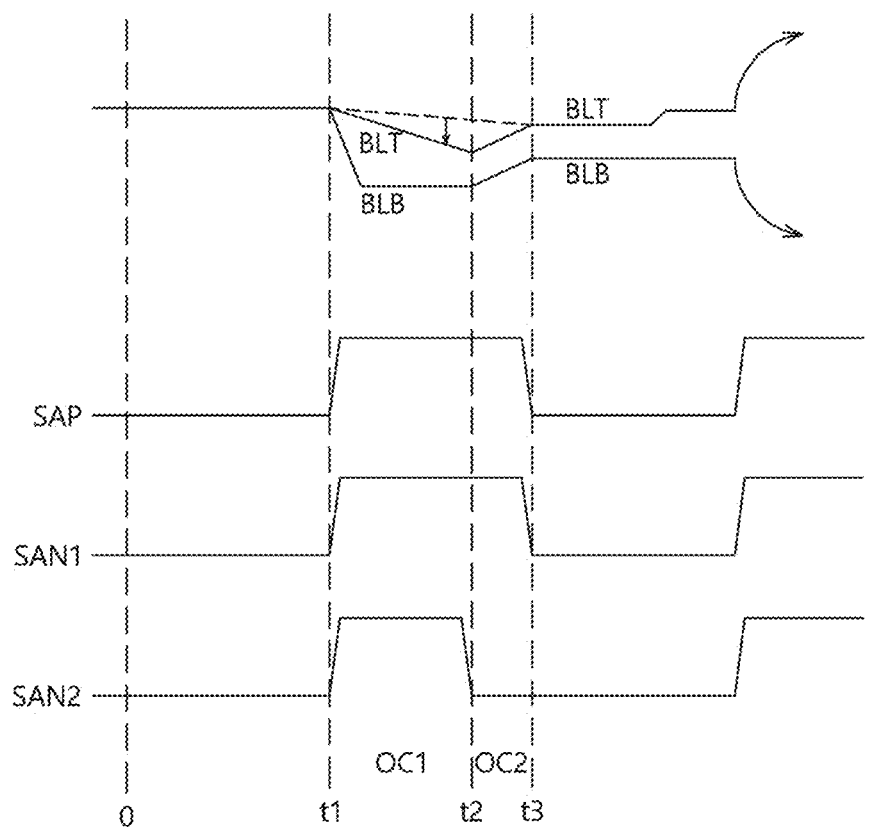
FIG. 10B is a timing chart illustrating operations of an edge sense amplifier.

FIG. 10A is a circuit diagram illustrating the edge sense amplifier ESA, and FIG. 10B is a timing chart illustrating operations of the edge sense amplifier ESA. For convenience of explanations, any further illustrations with respect to elements substantially the same as those in FIG. 9 may be omitted herein for brevity.

Referring to FIG. 10A, the edge sense amplifier ESA may include a detection amplifier 50, a pull-up controller 60, and a pull-down controller 70. The detection amplifier 50 may detect and amplify a voltage difference between the positive bit line BLT and the negative bit line BLB. The pull-up controller 60 may provide the detection amplifier 50 with a pull-up voltage. The pull-down controller 70 may provide the detection amplifier 50 with a pull-down voltage.

The pull-up controller 60 may provide a pull-up power supply terminal RTO of the detection amplifier 50 with a power voltage VDD in response to a pull-up amplification activation signal SAP.

The pull-down controller 70 may provide pull-down power supply terminals SB1 and SB2 of the detection amplifier 50 with a ground voltage VSS in response to pull-down amplification activation signals SAN1 and SAN2. The pull-down controller 70 may include a first pull-down controller 71 and a second pull-down controller 73. The first pull-down controller 71 may provide the first pull down power supply terminal SB1 of the detection amplifier 50 with a first ground voltage VSS1 in response to the first pull-down amplification activation signal SAN1. The second pull-down controller 73 may provide the second pull down power supply terminal SB2 of the detection amplifier 50 with a second ground voltage VSS2 in response to the second pull-down amplification activation signal SAN2.

The pull-up amplification activation signal SAP, the first pull-down amplification activation signal SAN1, and the second pull-down amplification activation signal SAN2 may be activated to a high level when the active operation. The power voltage VDD, the first ground voltage VSS1, and the second ground voltage VSS2 may be supplied to the pull-up power supply terminal RTO, the first pull-down power supply terminal SB1 and the second pull-down power supply terminal SB2 of the detection amplifier 50, respectively, by the activated pull-up amplification activation signal SAP, the activated first pull-down amplification activation signal SAN1 and the activated second pull-down amplification activation signal SAN2.

Because an edge MAT may not exist as shown in FIG. 4, the edge sense amplifier ESA may not sense by two-arm bit line structure. The edge sense amplifier ESA may sense by one arm bit line structure. Therefore, a deterioration of a sensing margin may be generated by sensing noises.

Further, as shown in FIG. 10B, slopes of the positive bit line BLT and the negative bit line BLB in an offset cancellation section may be different from each other. That is, the slope of the negative bit line BLB may be higher than the slope of the positive bit line BLT. Thus, a time for saturating offset cancellation information of the positive bit line BLT may be delayed to generate the deterioration of the sensing speed.

In example embodiments, the first ground voltage VSS1 and the second ground voltage VSS2 may be provided to the first pull-down power supply terminal SB1 and the second pull-down power supply terminal SB2 of the detection amplifier 50 from the active operation to a first time to rapidly saturate the offset cancellation information of the positive bit line BLT as shown in FIG. 10B. In FIG. 10B, a dotted line may represent the slope of the positive bit line BLT in the offset cancellation section when the edge sense amplifier ESA may include one pull-down controller. A solid line may represent the slope of the positive bit line BLT in the offset cancellation section when the edge sense amplifier ESA may include two pull-down controllers. A section t1 to t2 from the active operation to the first time may correspond to a first offset cancellation section OC1.

Because the two ground voltages VSS1 and VSS2 may be supplied to the pull-down power supply terminals SB1 and SB2 in the first offset cancellation section OC1, the voltage levels of the positive bit line BLT and the negative bit line BLB may be dropped to an undesired level.

In order to solve the above-mentioned drop, the second pull-down amplification activation signal SAN2 may be inactivated to a low level after the first time t2 may be elapsed. The pull-up amplification activation signal SAP and the first pull-down amplification activation signal SAN1 may be maintained as the high level. Thus, the power voltage VDD and the first ground voltage VSS1 may be supplied to the pull-up power supply terminal RTO and the first pull-down power supply terminal SB1 of the detection amplifier 50, respectively. In contrast, the second ground voltage VSS2 may not be supplied to the second pull-down power supply terminal SB2 of the detection amplifier 50.

Therefore, as shown in FIG. 10B, the voltage levels of the positive bit line BLT and the negative bit line BLB may be increased from the first time t2 to a second time t3. A section between the first time t2 and the second time t3 may correspond to a second offset cancellation section OC2. After the second time t3 may be elapsed, the pull-up amplification activation signal SAP and the first pull-down amplification activation signal SAN1 may be inactivated to a low level.

Figure 11:
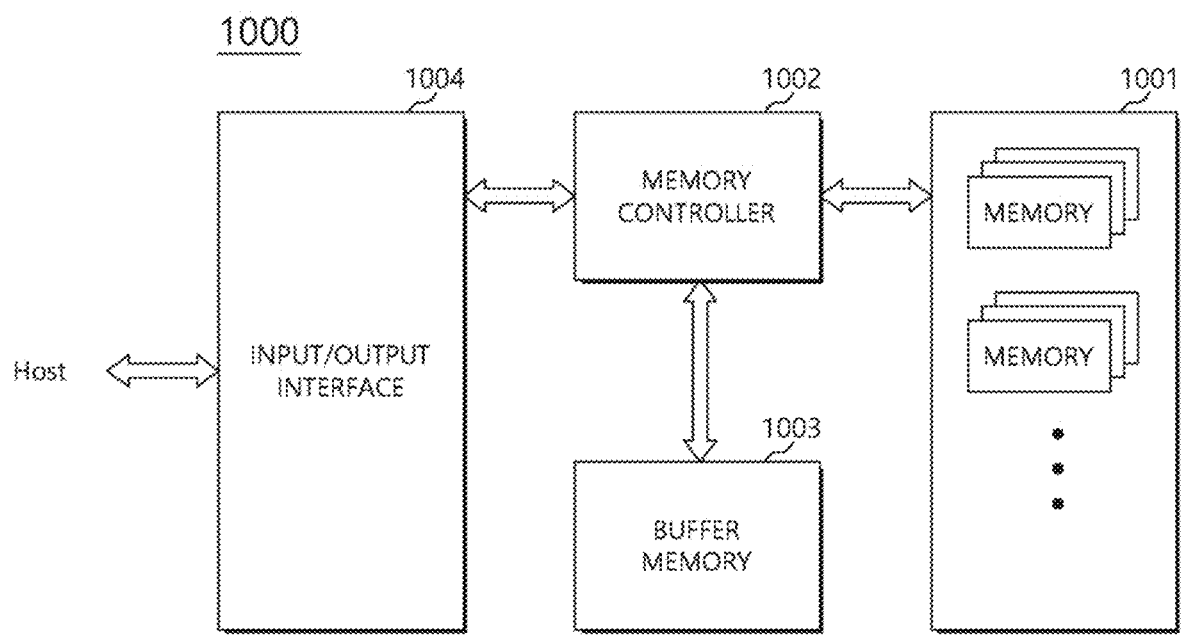
FIG. 11 is a view illustrating an electronic system including the semiconductor device in accordance with an embodiment of the present disclosure.

FIG. 11 is a view illustrating an electronic system including the semiconductor device of example embodiments.

Referring to FIG. 11, an electronic system 1000 of this example embodiment may include a data storage circuit 1001, a memory controller 1002, a buffer memory 1003 and an input/output interface 1004.

The data storage circuit 1001 may store data applied from the memory controller 1002 by control signals of the memory controller 1002. The data storage circuit 1001 may read the stored data. The data storage circuit 1001 may output the read data to the memory controller 1002. The data storage circuit 1001 may include a non-volatile memory for continuously storing the data when a power may be cut off. The non-volatile memory may include a NOR flash memory, a NAND flash memory, a phase changeable random access memory (PRAM), a resistive random access memory (RRAM), a spin transfer torque random access memory (STTRAM), a magnetic random access memory (MRAM), etc.

The memory controller 1002 may decode commands applied from an external device such as a host device through the input/output interface 1004. The memory controller 1002 may control data input/output of the data storage circuit 1001 and the buffer memory 1003 in accordance with decoded results. In FIG. 9, the memory controller 1002 may be shown as one block. However, the present invention is not limited thereto. For example, the memory controller 1002 may include a controller for controlling the data storage circuit 1001 and a controller for controlling the buffer memory 1003.

The buffer memory 1003 may temporarily store the data processed by the memory controller 1002, i.e., the data inputted/outputted into/from the data storage circuit 1001. The buffer memory 1003 may store the data applied from the memory controller 1002 by the control signal. The buffer memory 1003 may read the stored data. The buffer memory 1003 may output the read data to the memory controller 1002. The buffer memory 1003 may include a non-volatile memory such as a DRAM, an SRAM, etc.

The input/output interface 1004 may provide the memory controller 1002 and the external device with a physical connection so that the memory controller 1002 may receive the control signals for inputting/outputting the data from the external device and the data may be transmitted between the memory controller 1002 and the external device. The input/output interface 1004 may include any one of various interface protocols such as a USB, an MMC, a PCI-E, an SAS, an SATA, a PATA, an SCSI, an ESDI, an IDE, etc.

The electronic system 1000 may be used as an auxiliary memory device of the host device or an external storage device. The electronic system 1000 may include a solid state disk (SSD), a universal serial bus (USB) memory, a secure digital (SD) card, a mini secure digital card (mSD), a micro secure digital card (micro SD), a secure digital high capacity (SDHC), a memory stick card, a smart media card (SM), a multi media card (MMC), an embedded multi media card (eMMC), a compact flash card (CF), etc. The semiconductor device of this example embodiment may be applied to the buffer memory 1003.

Figure 12:
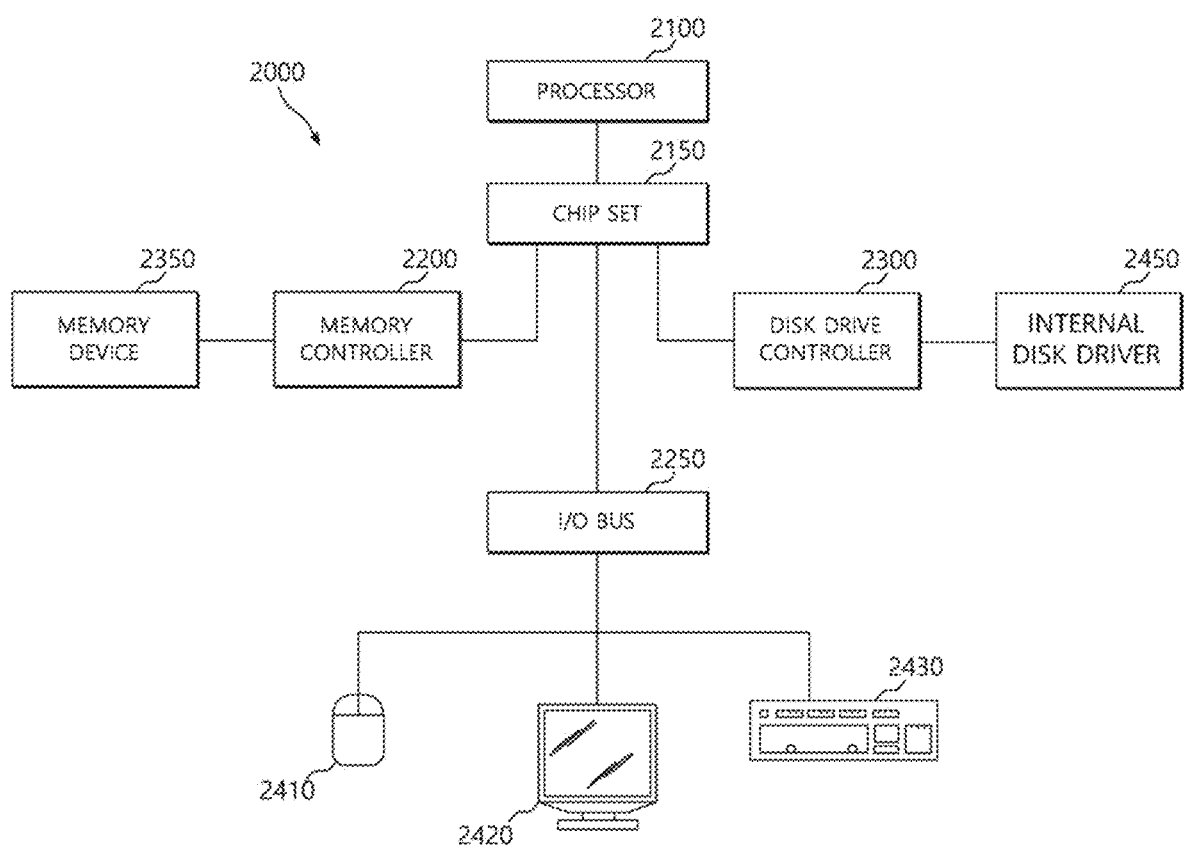
FIG. 12 is a view illustrating a system including the semiconductor device in accordance with an embodiment of the present disclosure.

FIG. 12 is a view illustrating a system including the semiconductor device of example embodiments.

The semiconductor device of this example embodiment may be usefully used in a memory device, a processor and a computer system. For example, the system 2000 may use the semiconductor device in FIG. 1 as a memory device 2350.

The system 2000 may include at least one processor 2100 or a central processing unit (CPU). The processor 2100 may be individually used. Alternatively, the processor 2100 may be used with other CPUs. In example embodiments, the system 2000 may include one processor 2100. Alternatively, the system 2000 may include a plurality of physical or logical CPUs.

A chip set 2150 may be connected with the processor 2100. The chip set 2150 may be a communication path for transmitting signals between the processor 2100 and other devices of the system 2000. The other device of the system 2000 may include a memory controller 2200, an input/output (I/O) bus 2250 and a disk drive controller 2300.

In a configuration of the system 2000, different signals may be transmitted through the chip set 2150. The memory controller 220 may be connected with the chip set 2150. The memory controller 2200 may include the semiconductor device in FIG. 1.

The memory controller 2200 may receive request signals from the processor 2100 through the chip set 2150. The memory controller 2200 may be arranged in the chip set 2150.

The memory controller 2200 may be connected with at least one memory device 2350. In example embodiments, the memory device 2350 may include the semiconductor device in FIG. 1. The memory device 2350 may include the word lines and the bit lines for defining the memory cells.

The chip set 2150 may be connected with the I/O bus 2250. The I/O bus 2250 may be a communication path for transmitting signals between the chip set 2150 and input/output devices 2410, 2420 and 2430. The input/output devices 2410, 2420 and 2430 may include a mouse 2410, a video display 2420 and a keyboard 2430.

The I/O bust 2250 may use any one of communication protocols for communicating with the input/output devices 2410, 2420 and 2430. The I/O bus 2250 may be arranged in the chip set 2150.

The disk drive controller 2300 may be connected with the internal disk driver 2450. The disk drive controller 2300 may be a communication path between the chip set 2150 and the at least one internal disk driver 2450. The internal disk driver 2450 may store commands and data to readily perform a disconnection of the external data storage device.

The disk drive controller 2300 and the internal disk driver 2450 may be communicated with each other. Alternatively, the disk driver controller 2300 and the internal disk driver 2450 may be communicated with each other through the chip set 2150 using a communication protocol.

In FIG. 12, the system 2000 may include the semiconductor device in FIG. 1. However, the system 2000 may include other devices.

Figure 13:
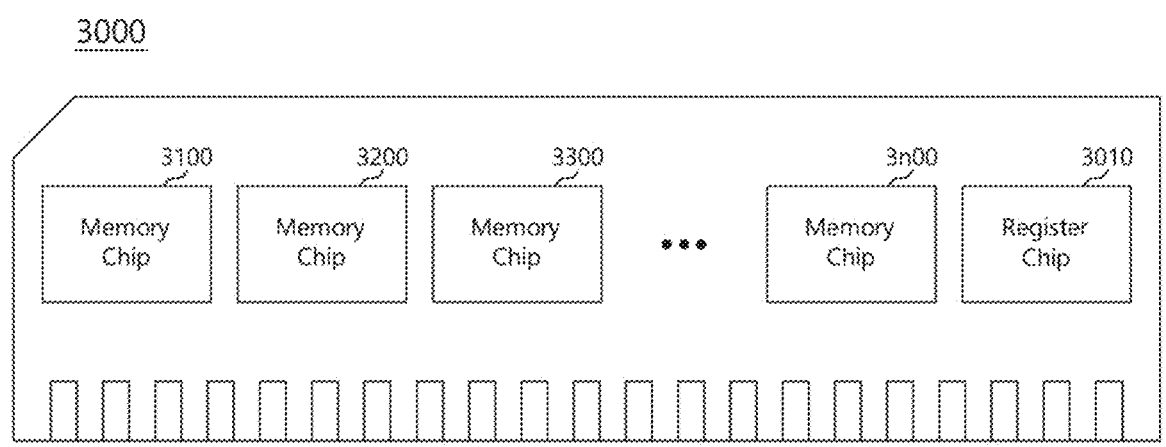
FIG. 13 is a view illustrating a memory module including the semiconductor device in accordance with an embodiment of the present disclosure.

FIG. 13 is a view illustrating a memory module including the semiconductor device of example embodiments.

Referring to FIG. 13, a memory module 3000 may include a plurality of memory chips 3100 to 3n00 and a register chip 3010. The memory chips 3100 to 3n00 may include the semiconductor device 100 in FIG. 1.

The memory chips 3100 to 3n00 may receive a command, an address, data, etc., from an external device such as a host, a memory controller, an AP, etc. The memory chips 3100 to 3noo may perform a read operation and a write operation of the data. The register chip 3010 may receive a command, a control signal, etc., from the external device. The register chip 3010 may store mode register set (MRS) information based on the received command and control signals. The memory chips 3100 to 3n00 may include the semiconductor device illustrated with reference to FIGS. 2 to 10B.

Figure 14:
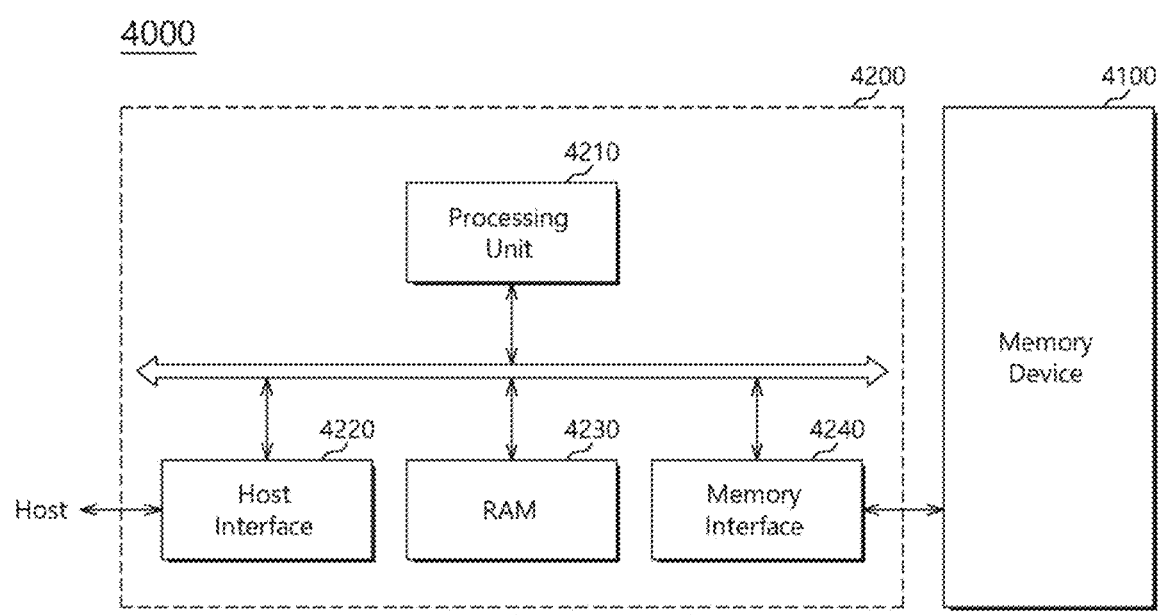
FIG. 14 is a block diagram illustrating a memory system including the semiconductor device in accordance with an embodiment of the present disclosure.

FIG. 14 is a block diagram illustrating a memory system including the semiconductor device of example embodiments.

Referring to FIG. 14, a memory system 4000 may include a memory device 4100 and a memory controller 4200.

The memory controller 4200 may be connected with a host and the memory device 4100. The memory controller 4200 may transmit data read from the memory device 4100 to the host. The memory controller 4200 may store the data transmitted from the host in the memory device 4100.

The memory controller 4200 may include a processing unit 4210, a host interface 4220, a RAM 4230 and a memory interface 4240. The processing unit 4210 may control whole operations of the memory controller 4200. The host interface 4220 may include a protocol for performing data exchange between host and the memory controller 4200. For example, the memory controller 4200 may be communicated with the host through a USB, an MMC, a PCI-E, an advanced technology attachment (ATA), a serial-ATA, a parallel-ATA, an SCSI, an ESDI, an integrated drive electronics (IDE), an embedded multi media card (eMMC), an universal flash storage (UFS), etc. The RAM 4230 may be used as an operational memory of the processing unit 4210. The RAM 4230 may include the semiconductor device illustrated with reference to FIGS. 2 to 10B. The RAM 4230 may be operated based on the operations of the semiconductor device illustrated with reference to FIGS. 2 to 10B.

The memory interface 4240 may interface with the memory device 4100. The memory controller 4200 may further include an error correction block. The error correction block may detect and correct errors of the data read from the memory device 4100.

The memory controller 4200 and the memory device 4100 may be integrated into one semiconductor device. The memory controller 4200 and the memory device 4100 may be integrated into one semiconductor device to form a memory card. For example, the memory controller 4200 and the memory device 4100 may be integrated into one semiconductor device to form a PC card (PCMCIA), a compact flash card (CF), a smart media card (SM/SMC), a memory stick, a multi media card (MMC, RS-MMC, MMCmicro), an SD card (SD, miniSD, microSD), a universal flash storage (UFS), etc.

Alternatively, the memory controller 4200 and the memory device 4100 may be integrated into one semiconductor device to form a semiconductor solid state disk/drive (SSD). When the memory system 4000 may be used as the semiconductor disk (SSD), the host connected with the memory system 4000 may have improved operational speed.

Further, the memory system 4000 may be applied to a PDA, a portable computer, a web tablet, a wireless phone, a mobile phone, a digital music player, devices for wireless communicating information, etc.

Figure 15:
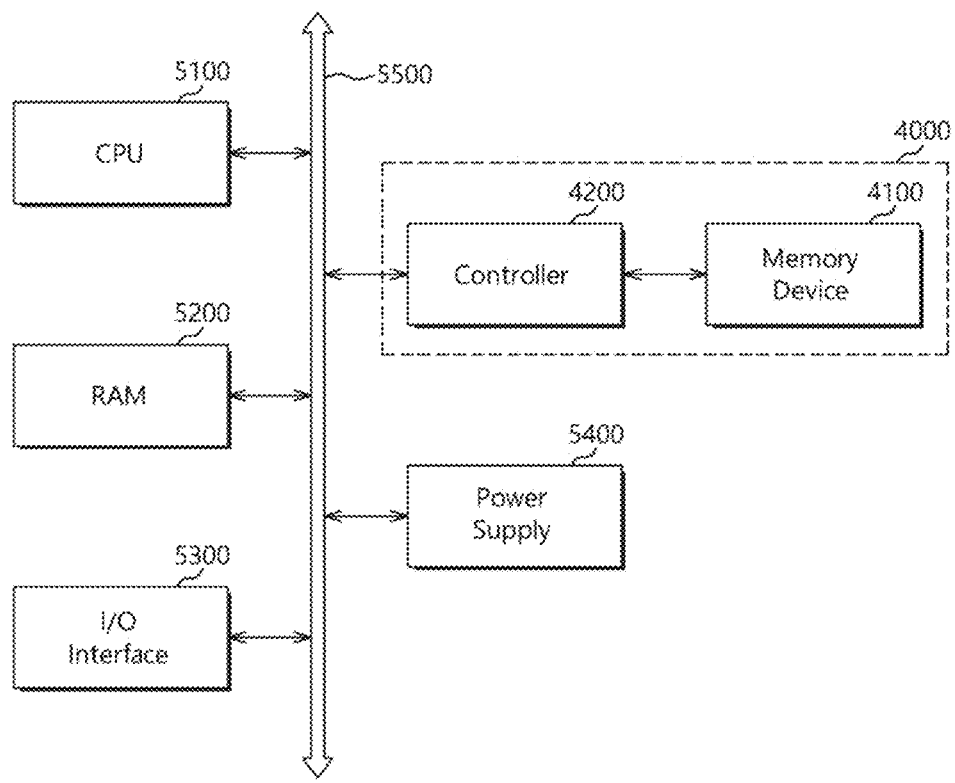
FIG. 15 is a block diagram illustrating a computing system including the memory system in FIG. 14.

FIG. 15 is a block diagram illustrating a computing system including the memory system in FIG. 14.

Referring to FIG. 15, a computing system 5000 may include a central processing unit (CPU) 5100, an RAM 5200, an input/output interface 5300, a power 5400 and a memory system 4000.

The memory system 4000 may be electrically connected to the CPU 5100, the RAM 5200, the input/output interface 5300 and the power 5400 through a system bus 5600. Data provided from the input/output interface 5300 or processed by the CPU 5100 may be stored in the memory system 4000. The memory system 4000 may include a controller 4200 and a non-volatile memory device 4100.

For example, the RAM 5200 may be an operational memory of the computing system 5000. The RAM 5200 may include the semiconductor device illustrated with reference to FIGS. 2 to 10B. The RAM 5200 may be operated based on the operations of the semiconductor device illustrated with reference to FIGS. 2 to 10B. Further, the RAM 5200 may include the memory module illustrated with reference to FIG. 13.

Figure 16:
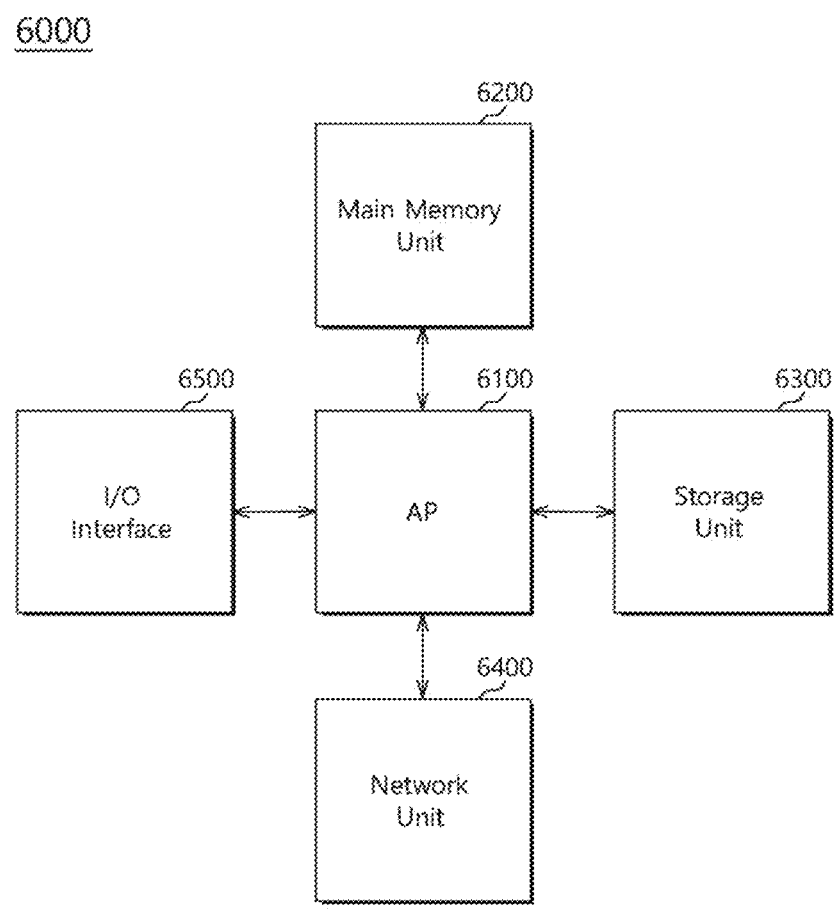
FIG. 16 is a block diagram illustrating a user system including the semiconductor device in accordance with an embodiment of the present disclosure.

FIG. 16 is a block diagram illustrating a user's system including the semiconductor device of example embodiments.

Referring to FIG. 16, the user's system 6000 may be used as computing systems such as an ultra mobile PC (UMPC), a workstation, a net-book, a personal digital assistant (PDA), a portable computer, a web tablet, a wireless phone, a mobile phone, a smart phone, an e-book, a portable multi media player (PMP), a portable game machine, a navigation, a black box, a digital camera, a digital multi media broadcasting (DMB) player, a digital audio recorder, a digital audio player, a digital picture recorder, a digital picture player, a digital video recorder, a digital video player, etc.

The user's system 6000 may include an application processor (AP) 6100, a main memory unit 6200, a storage unit 6300, a network unit 6400 and an input/output (I/O) interface 6500. The application processor 6100 may drive elements, an operating system, etc., in the user's system 6000. For example, the application processor 6100 may include controllers for controlling the elements in the user's system 6000 and interfaces.

The main memory unit 6200 may be an operational memory of the user's system 6000. The main memory unit 6200 may be a buffer memory for compensating a speed difference between the application processor 6100 and the storage unit 6300. For example, the main memory unit 6200 may be a random access memory device such as a dynamic random access memory (DRAM), a synchronous DRAM (SDRAM), a static DRAM (SRAM), a double date rate (DDR) SDRAM, a DDR2 SDRAM, a DDR3 SDRAM, a phase changeable RAM (PRAM), a magnetic RAM (MRAM), a resistive RAM (RRAM), etc. The main memory unit 6200 may be operated based on the operations illustrated with reference to FIGS. 2 to 10B.

The storage unit 6300 may store data. For example, the storage unit 6300 may store the data received from an external device. The storage unit 6300 may transmit the stored data to the application processor 6100. The storage unit 6300 may be a massive capacity type semiconductor memory device such as a dynamic random access memory (DRAM), a synchronous DRAM (SDRAM), a static DRAM (SRAM), a double date rate (DDR) SDRAM, a DDR2 SDRAM, a DDR3 SDRAM, a phase changeable RAM (PRAM), a magnetic RAM (MRAM), a resistive RAM (RRAM), a NAND flash, a NOR flash, etc., or a massive capacity type magnetic disk device such as a hard disk drive.

The network unit 6400 may be communicated with the external devices. The network unit 6400 may aid a wireless communication such as code division multiple access (CDMA), a global system for mobile communication (GSM), a wideband CDMA (WCDMA), a CDMA-2000, a time division multiple access (TDMA), a long term evolution (LTE), a Wimax, a WLAN, a UWB, a blue tooth, a WI-DI, etc.

The input/output interface 6500 may provide the user's system 6000 with an interface for inputting or outputting data or commands. The input/output interface 6500 may include a camera, a touch screen, a motion recognition module, a microphone, a display, a speaker, etc.

The above described embodiments of the present invention are intended to illustrate and not to limit the present invention. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:
1. A semiconductor device comprising:
a MAT including a plurality of memory cells;
a plurality of sense amplifier arrays arranged at one side of the MAT, each of the plurality of sense amplifier arrays including a plurality of sense amplifiers;

a plurality of first input/output lines arranged on the sense amplifier array, spaced apart from each other in a first direction and connected with the at least one sense amplifier through a switching element;

a plurality of column selection signal lines for transmitting a column selection signal to the switching element; and a plurality of second input/output lines connected to the first input/output lines through a contact and extended on the MAT in a second direction perpendicular to the first direction, wherein the column selection signal lines comprise:

at least one first column selection signal line extended on the sense amplifier array in the first direction; and at least one second column selection signal line different from the at least one first column selection signal line and extended on the sense amplifier array and the MAT in the second direction.

2. The semiconductor device of claim 1, wherein the column selection signal lines are extended on the sense amplifier array in the first direction.

3. The semiconductor device of claim 2, wherein the column selection signal lines and the first input/output lines are coplanar with each other.

4. The semiconductor device of claim 2, wherein the second input/output lines are arranged on a level higher than that on which the column selection signal lines and the first input/output lines are arranged.

5. The semiconductor device of claim 1, wherein the first column selection signal line comprises a metal layer coplanar with the first input/output lines, and the second column selection signal line comprises a metal layer coplanar with the second input/output lines.

6. The semiconductor device of claim 1, wherein the first column selection signal line is arranged on a level lower than that on which the second column selection signal line is arranged.

7. The semiconductor device of claim 1, wherein the column selection signal lines are extended on the sense amplifier array and the MAT in the second direction.

8. The semiconductor device of claim 7, wherein the column selection signal lines and the second input/output lines comprise metal layers arranged on a same plane.

9. The semiconductor device of claim 7, wherein the first input/output lines are arranged on a level lower than that on which the column selection signal lines and the second input/output lines are arranged.

10. The semiconductor device of claim 7, wherein the column selection signal lines transmit first column selection signals among the column selection signals to the sense amplifier array in response to a first enable signal, and the column selection signal lines transmit second column signals among the column selection signals except for the first column selection signals to the sense amplifier array in response to a second enable signal.

11. The semiconductor device of claim 10, further comprising a data register including a first data register and a second data register, the first data register for storing first data read by inputting the first column selection signals, and the second data register for storing second data read by inputting the second column selection signals.

12. The semiconductor device of claim 11, wherein the second input/output lines receive the first data outputted from the first input/output line and store the first data in the first data register, and the second input/output lines receive the second data outputted from the first input/output lines and store in the second data in the second data register.

13. The semiconductor device of claim 11, wherein the data register simultaneously outputs the first data in the first data register and the second data in the second data register.

* * * * *